US012740296B2

(12) United States Patent
Jin et al.

(10) Patent No.: US 12,740,296 B2
(45) Date of Patent: Sep. 15, 2026

(54) DISPLAY APPARATUS HAVING A LIGHT-EMITTING DEVICE

(71) Applicant: LG Display Co., Ltd., Seoul (KR)

(72) Inventors: You Yong Jin, Paju-si (KR); Young Bok Lee, Paju-si (KR); Sung Woo Kim, Paju-si (KR); Keong Jin Lee, Paju-si (KR); Yong Ku Lee, Paju-si (KR); Chi Yong Kim, Paju-si (KR); Won Sik Lee, Paju-si (KR); Se Wan Oh, Paju-si (KR); Seok Ho Ki, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 375 days.

(21) Appl. No.: 18/461,142

(22) Filed: Sep. 5, 2023

(65) Prior Publication Data

US 2024/0244937 A1 Jul. 18, 2024

(30) Foreign Application Priority Data

Jan. 16, 2023 (KR) ........................ 10-2023-0006262

(51) Int. Cl.

*H10K 59/80* (2023.01)
*H10K 59/12* (2023.01)
*H10K 59/40* (2023.01)

(52) U.S. Cl.

CPC ....... *H10K 59/879* (2023.02); *H10K 59/8792* (2023.02); *H10K 59/12* (2023.02); *H10K 59/40* (2023.02)

(58) Field of Classification Search

CPC ......................... H10K 59/879; H10K 59/8792
See application file for complete search history.

(56) References Cited

U.S. PATENT DOCUMENTS

| | | | |
|---|---|---|---|
| 11,056,546 | B2 | 7/2021 | Jung et al. |
| 11,579,476 | B2 | 2/2023 | You et al. |
| 11,895,867 | B2 | 2/2024 | Sui et al. |
| 12,010,895 | B2 | 6/2024 | Wang |

(Continued)

FOREIGN PATENT DOCUMENTS

| | | | |
|---|---|---|---|
| CN | 110858604 | A | 3/2020 |
| CN | 111108602 | A | 5/2020 |

(Continued)

OTHER PUBLICATIONS

Japan Patent Office, Office Action, Japanese Patent Application No. 2024-001740, Jan. 21, 2025, 12 pages.

(Continued)

*Primary Examiner* — Mariceli Santiago
(74) *Attorney, Agent, or Firm* — Fenwick & West LLP

(57) ABSTRACT

A display apparatus includes a substrate with a plurality of pixel areas. The display apparatus includes a light-emitting device formed in a pixel area for emitting light. An encapsulation unit is formed on the light-emitting device. The display apparatus includes a black matrix on the encapsulation unit, where an opening in the black matrix overlaps with the light-emitting device in a first direction. An upper surface of the control insulating layer is formed with a groove that is a recessed portion toward the substrate. An optical lens is disposed above the groove in the control insulating layer.

15 Claims, 22 Drawing Sheets

(56) References Cited

U.S. PATENT DOCUMENTS

| | | | | |
|---|---|---|---|---|
| 2012/0261698 | A1* | 10/2012 | Shiozaki | H10K 59/8792 257/E51.001 |
| 2014/0339509 | A1* | 11/2014 | Choi | H10K 59/879 257/40 |
| 2014/0361264 | A1 | 12/2014 | Choi et al. | |
| 2016/0087018 | A1* | 3/2016 | Shim | H10K 59/38 257/40 |
| 2019/0221779 | A1 | 7/2019 | Jang et al. | |
| 2020/0066804 | A1 | 2/2020 | Jung et al. | |
| 2021/0193968 | A1 | 6/2021 | Lee et al. | |
| 2022/0077431 | A1 | 3/2022 | Lee et al. | |
| 2022/0085335 | A1 | 3/2022 | Shimatsu | |
| 2022/0221748 | A1 | 7/2022 | You et al. | |
| 2022/0246697 | A1 | 8/2022 | Wang et al. | |
| 2023/0060696 | A1* | 3/2023 | Li | H10K 59/879 |
| 2023/0116030 | A1 | 4/2023 | Sui et al. | |
| 2023/0200184 | A1 | 6/2023 | Wang | |
| 2024/0196644 | A1 | 6/2024 | Sugi | |

FOREIGN PATENT DOCUMENTS

| | | | |
|---|---|---|---|
| EP | 3511808 | A1 | 7/2019 |
| KR | 10-2014-0143916 | A | 12/2014 |
| KR | 10-2020-0061911 | A | 6/2020 |
| KR | 10-2020-0075597 | A | 6/2020 |
| KR | 10-2021-0078802 | A | 6/2021 |
| KR | 10-2022-0033770 | A | 3/2022 |
| KR | 10-2022-0102222 | A | 7/2022 |
| WO | WO 2022/007151 | A1 | 1/2022 |
| WO | WO 2022/185845 | A1 | 9/2022 |

OTHER PUBLICATIONS

European Patent Office, Extended European Search Report, European Patent Application No. 23198770.2, Feb. 26, 2024, eight pages.

Taiwan Intellectual Property Office, Office Action, Taiwanese Patent Application No. 112133690, Jun. 11, 2024, 16 pages.

* cited by examiner

FIG. 2

PA
DL
PL
GL
T1
T2
DC
Cst
300

Figure 21:
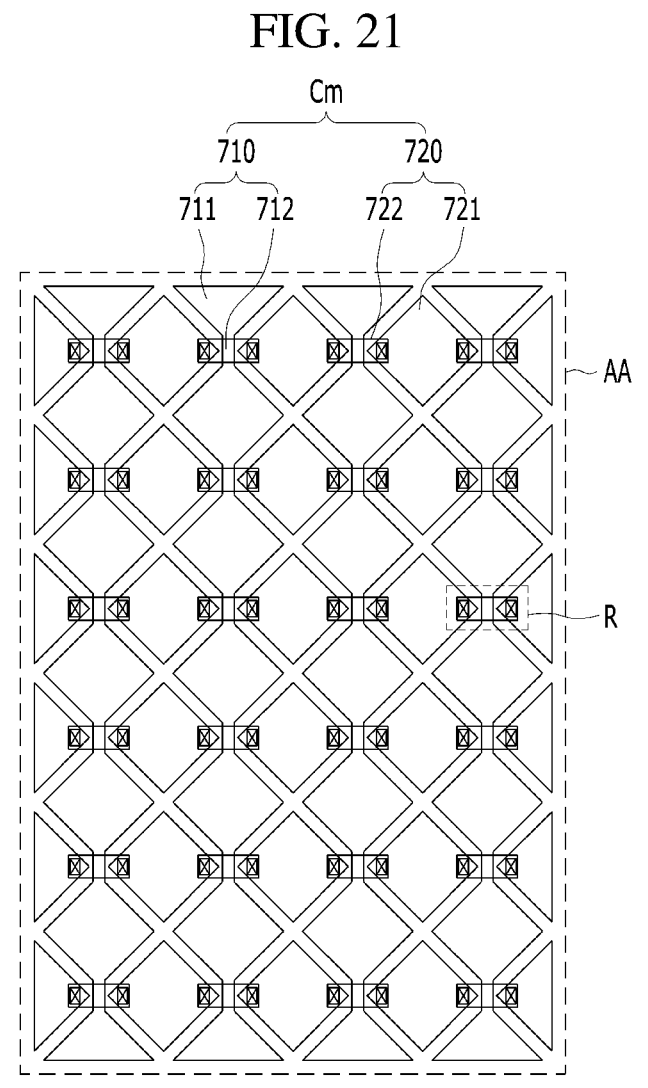

DISPLAY APPARATUS HAVING A LIGHT-EMITTING DEVICE

CROSS-REFERENCE TO RELATED APPLICATIONS

This application claims the benefit of Republic of Korea Patent Application No. 10-2023-0006262, filed on Jan. 16, 2023, which is hereby incorporated by reference as if fully set forth herein.

BACKGROUND

Field

The present disclosure relates to a display apparatus in which a light-emitting device is disposed on a pixel area of a device substrate.

Discussion of the Related Art

Generally, a display apparatus provides an image. For example, the display apparatus may include a plurality of light-emitting device. Each of the light-emitting devices may emit light displaying a specific color. For example, each of the light-emitting devices may include a first electrode, a light-emitting layer and a second electrode, which are sequentially stacked.

An image realized by the display apparatus may be not recognized by people around a user. For example, the display apparatus may include a viewing angle control unit limiting a traveling path of the light emitted from each light-emitting device. The viewing angle control unit may include at least one black matrix. The black matrix may include openings overlapping with the light-emitting devices. The light generated by each light-emitting device may be emitted outside through one of the openings of the black matrix.

However, in the display apparatus, the amount of the light provided to the user may be reduced by the black matrix. That is, in the display apparatus, the light-extraction efficiency of the light generated by each light-emitting device may be decreased by the black matrix. Thus, in the display apparatus, the luminance of the realized image may be decreased as a whole.

SUMMARY

Accordingly, the present disclosure is directed to a display apparatus that substantially obviates one or more problems due to limitations and disadvantages of the related art.

An object of the present disclosure is to provide a display apparatus capable of limiting the viewing angle and improving the light-extraction efficiency.

Another object of the present disclosure is to provide a display apparatus capable of increasing the amount of the light passing though the opening of the black matrix on the light-emitting device.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In one embodiment, a display apparatus includes a substrate with a pixel area, a light-emitting device formed in the pixel area for emitting light, an encapsulation unit on the light-emitting device, and a black matrix on the encapsulation unit. The black matrix is formed with an opening, in which the opening in the black matrix overlaps with the light-emitting device in a first direction. The display apparatus includes an insulating layer on the encapsulation unit. An upper surface of the insulating layer may be formed with a groove that is a recessed portion toward the substrate. The groove may overlap with the opening in the black matrix in the first direction. The display apparatus includes an optical lens disposed above the groove in the insulating layer.

In one embodiment, a display apparatus includes a substrate with a pixel area, a light-emitting device formed in the pixel area for emitting light, an insulating layer on the light-emitting device, and a touch electrode on the insulating layer. At least a part of the touch electrode may be formed with an opening. An upper surface of the insulating layer may be formed with a groove that is a recessed portion toward the substrate within the opening. The display apparatus includes an optical lens covering the opening.

BRIEF DESCRIPTION OF THE DRAWINGS

The accompanying drawings, which are included to provide a further understanding of the present disclosure and are incorporated in and constitute a part of this application, illustrate embodiment (s) of the present disclosure and together with the description serve to explain the principle of the present disclosure. In the drawings:

FIG. 2 is a view showing a circuit of a unit pixel area in the display apparatus according to the embodiment of the present disclosure.

FIG. 3 is a view showing a cross-section of the pixel area in the display apparatus according to the embodiment of the present disclosure.

FIGS. 5 to 9 are views sequentially showing a method of forming the display apparatus according to the embodiment of the present disclosure.

FIGS. 10 to 24 are views showing the display apparatus according to other embodiments of the present disclosure.

DETAILED DESCRIPTION

Figure 1:
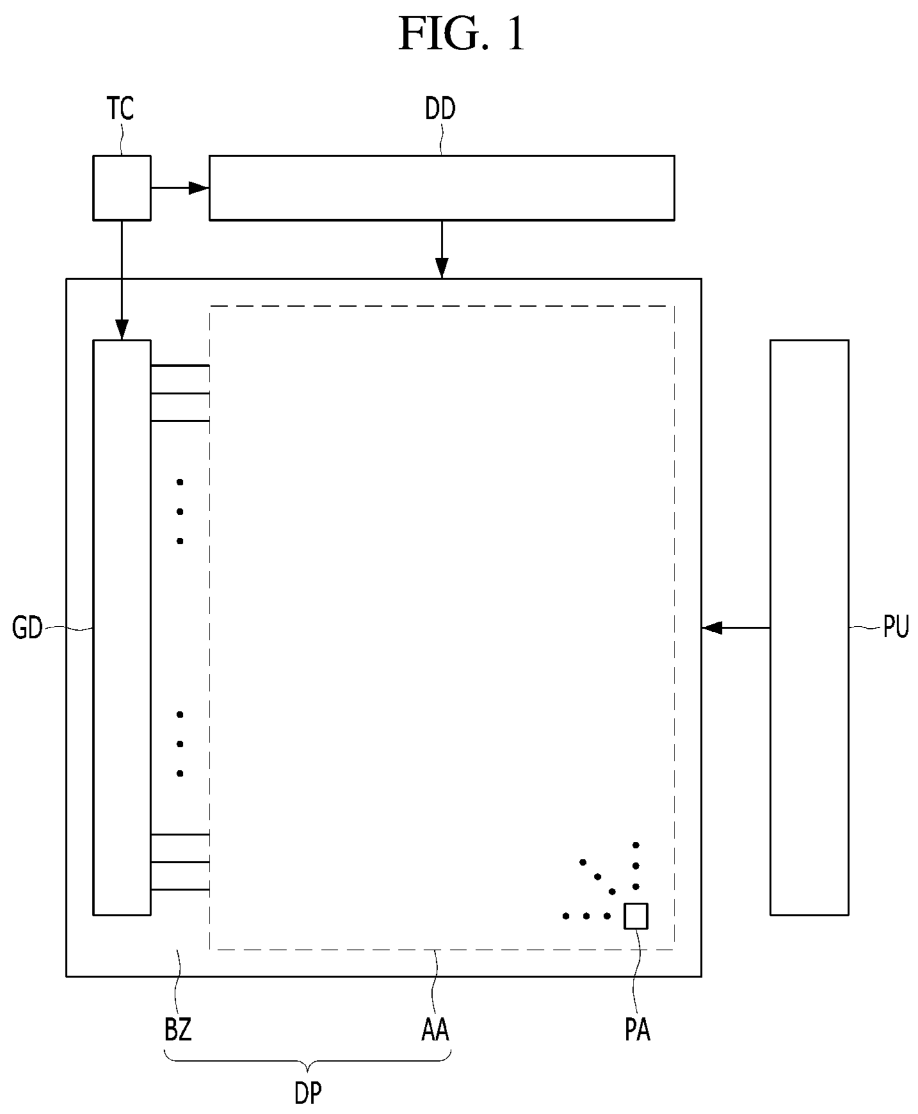
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being “on” a second element, although the first element may be disposed on the second element so as to come into contact with the second element, a third element may be interposed between the first element and the second element.

Here, terms such as, for example, and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
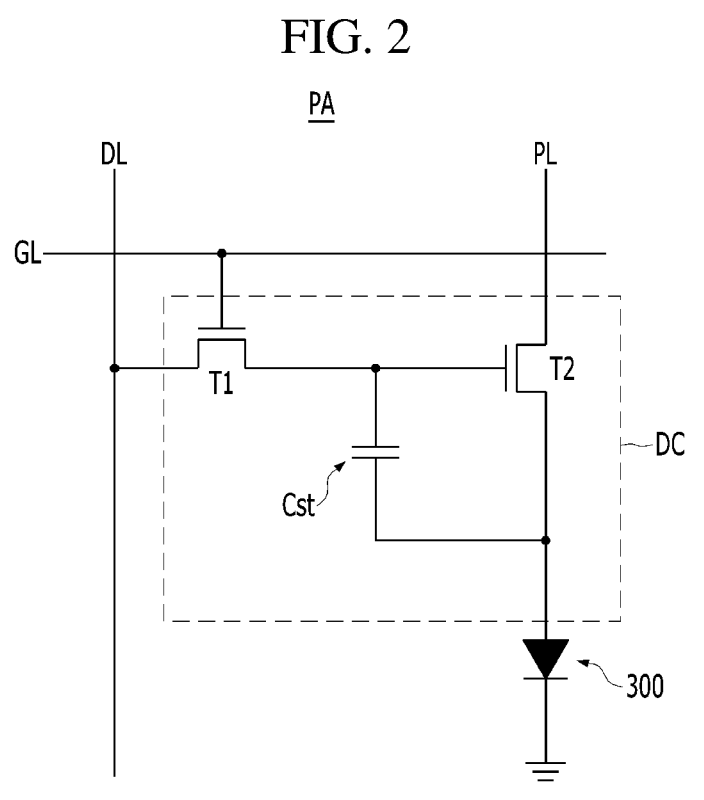

FIG. 1 is a view schematically showing a display apparatus according to an embodiment of the present disclosure. FIG. 2 is a view showing a circuit of a unit pixel area in the display apparatus according to the embodiment of the present disclosure.

Referring to FIGS. 1 and 2, the display apparatus according to the embodiment of the present disclosure may include a display panel DP. The display panel DP may generate an image provided to a user. For example, the display panel DP may include a plurality of pixel areas PA.

Various signals may be provided in each pixel area PA through signal wirings GL, DL and PL. For example, the signal wirings GL, DL and PL may include gate lines GL applying a gate signal to each pixel area PA, data lines DL applying a data signal to each pixel area PA, and power voltage supply lines PL supplying a power voltage to each pixel area PA. The gate lines GL may be electrically connected to a gate driver GD, and the data lines DL may be electrically connected to a data driver DD. The gate driver GD and the data driver DD may be controlled by a timing controller TC. For example, the gate driver GD may receive clock signals, reset signals and a start signal from the timing controller TC, and the data driver DD may receive digital video data and a source timing signal from the timing controller TC. The power voltage supply lines PL may be electrically connected to a power unit PU.

The display panel DP may include a display area AA in which the pixel areas PA are disposed, and a bezel area BZ disposed outside the display area AA. At least one of the gate driver GD, the data driver DD, the timing controller TC and the power unit PU may be disposed on the bezel area BZ of the display panel DP. For example, the display apparatus according to the embodiment of the present disclosure may be a GIP (Gate In Panel) type display apparatus in which the gate driver GD is formed on the bezel area BZ of the display panel DP.

Each of the pixel areas PA may realize a specific color. For example, a pixel driving circuit DC electrically connected to a light-emitting device 300 may be disposed in each pixel area PA. The pixel driving circuit DC of each pixel area PA may be disposed on a device substrate 100. The device substrate 100 may include an insulating material. For example, the device substrate 100 may include glass or plastic.

The pixel driving circuit DC of each pixel area PA may supply a driving current corresponding to the data signal to the light-emitting device 300 of the corresponding pixel area PA according to gate signal for one frame. For example, the pixel driving circuit DC of each pixel PA may include a first thin film transistor T1, a second thin film transistor T2 and a storage capacitor Cst.

Figure 3:
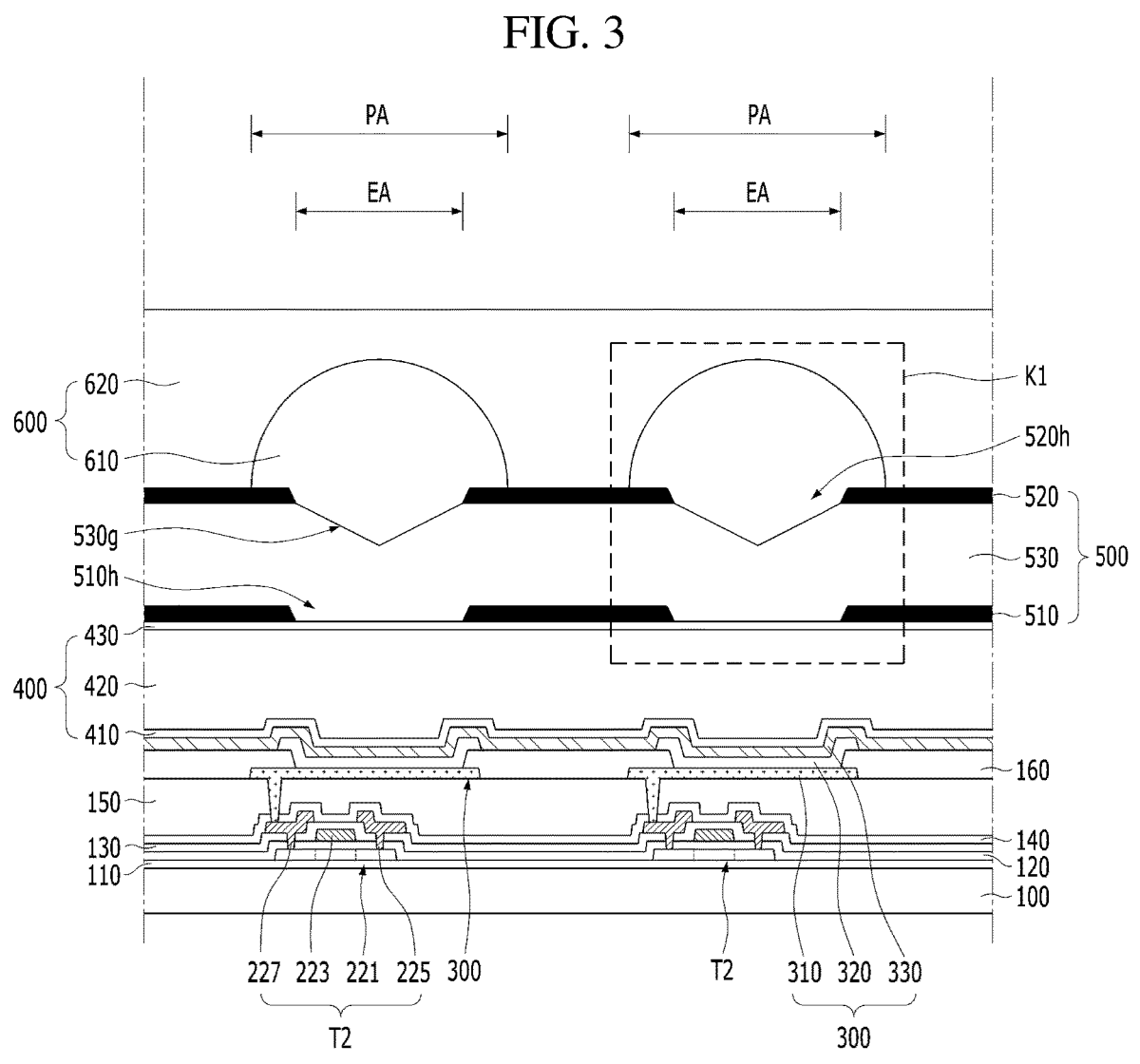
Figure 4:
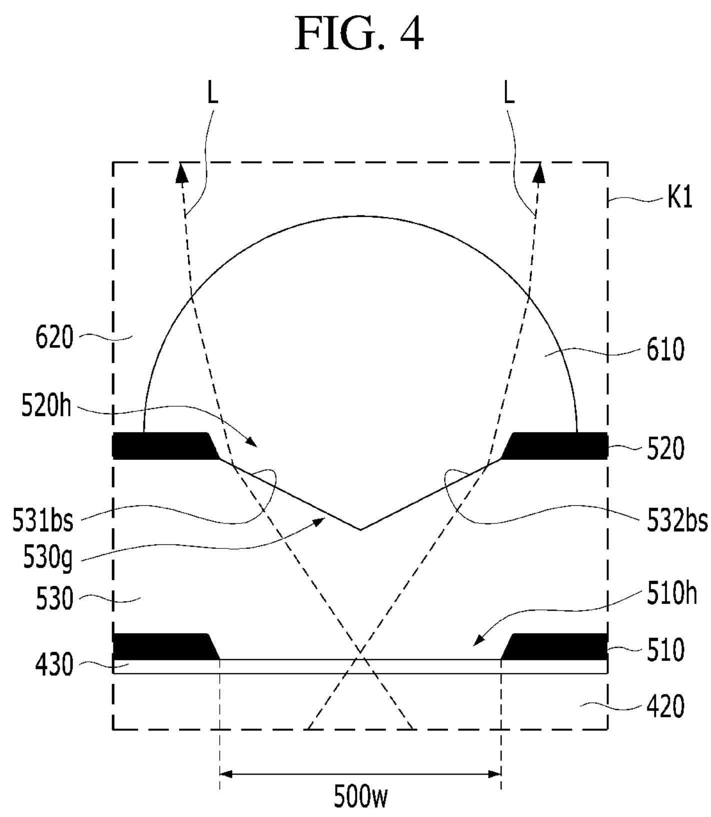
FIG. 4 is an enlarged view of K1 region in FIG. 3 according to an embodiment of the present disclosure.

FIG. 3 is a view showing a cross-section of the pixel area in the display apparatus according to the embodiment of the present disclosure. FIG. 4 is an enlarged view of K1 region in FIG. 3.

Referring to FIGS. 2 to 4, the first thin film transistor T1 may include a first semiconductor pattern, a first gate electrode, a first drain electrode and a first source electrode. The first thin film transistor T1 may transmit the data signal to the second thin film transistor T2 according to the gate signal. For example, the first thin film transistor T1 may be a switching thin film transistor. The first gate electrode may be electrically connected to one of the gate lines GL, and the first drain electrode may be electrically connected to one of the date lines DL.

The first semiconductor pattern may include a semiconductor material. For example, the first semiconductor pattern may include amorphous silicon (a-Si), polycrystalline silicon (poly-Si) or an oxide semiconductor, such as IGZO. The first semiconductor pattern may include a first drain region, a first channel region and a first source region. The first channel region may be disposed between the first drain region and the first source region. A resistance of the first drain region and a resistance of the first source region may be smaller than a resistance of the first channel region. For example, the first drain region and the first source region may include a conductive region of an oxide semiconductor. The first channel region may be a region of an oxide semiconductor, which is not conductorized.

The first gate electrode may include a conductive material. For example, the first gate electrode may include a metal, such as aluminum (Al), chrome (Cr), copper (Cu), molybdenum (Mo), titanium (Ti) and tungsten (W). The first gate electrode may be disposed on the first semiconductor pattern. For example, the first gate electrode may overlap the first channel region of the first semiconductor pattern. The first source region and the first drain region of the first semiconductor pattern may be disposed outside the first gate electrode. The first gate electrode may be insulated from the first semiconductor pattern. For example, the first source region of the first semiconductor pattern may be electrically connected to the first drain region of the first semiconductor pattern according to the gate signal.

The first drain electrode may include a conductive material. For example, the first drain electrode may include a metal, such as aluminum (Al), chrome (Cr), copper (Cu), molybdenum (Mo), titanium (Ti) and tungsten (W). The first drain electrode may include a material different from the first gate electrode. The first drain electrode may be disposed on a layer different from the first gate electrode. For example, the first drain electrode may be insulated from the first gate electrode. The first drain electrode may be electrically connected to the first drain region of the first semiconductor pattern.

The first source electrode may include a conductive material. For example, the first source electrode may include a metal, such as aluminum (Al), chrome (Cr), copper (Cu), molybdenum (Mo), titanium (Ti) and tungsten (W). The first source electrode may include a material different from the first gate electrode. The first source electrode may be disposed on a layer different from the first gate electrode. For example, the first source electrode may be disposed on a same layer as the first drain electrode. The first source electrode may include a same material as the first drain electrode. The first source electrode may be insulated from the first gate electrode. The first source electrode may be electrically connected to the first source region of the first semiconductor pattern.

The second thin film transistor T2 may include a second semiconductor pattern 221, a second gate electrode 223, a second drain electrode 225 and a second source electrode 227. The second thin film transistor T2 may generate the driving current corresponding to the data signal. For example, the second thin film transistor T2 may be a driving thin film transistor. The second gate electrode 223 may be electrically connected to the first source electrode, and the second drain electrode may be electrically connected to one of the power voltage supply lines PL.

The second semiconductor pattern 221 may include a semiconductor material. For example, the second semiconductor pattern 221 may include amorphous silicon (a-Si), polycrystalline silicon (poly-Si) or an oxide semiconductor, such as IGZO. The second semiconductor pattern 221 may include a second channel region between a second drain region and a second source region. The second drain region and a second source region may have a resistance smaller than the second channel region. For example, the second drain region and the second source region may include a conductive region of an oxide semiconductor. The second channel region may be a region of an oxide semiconductor, which is not conductorized.

The second semiconductor pattern 221 may include a same material as the first semiconductor pattern. The second semiconductor pattern 221 may be disposed on a layer same as the first semiconductor pattern. For example, the second semiconductor pattern 221 may be formed simultaneously with the first semiconductor pattern. A resistance of the second channel region may be the same as a resistance of the first channel region.

The second gate electrode 223 may include a conductive material. For example, the second gate electrode 223 may include a metal, such as aluminum (Al), chrome (Cr), copper (Cu), molybdenum (Mo), titanium (Ti) and tungsten (W). The second gate electrode 223 may be disposed on the second semiconductor pattern 221. For example, the second gate electrode 223 may overlap the second channel region of the second semiconductor pattern 221. The second drain region and the second source region of the second semiconductor pattern 221 may be disposed outside the second gate electrode 223. The second gate electrode 223 may be insulated from the second semiconductor pattern 221. For example, the second channel region of the second semiconductor pattern 221 may have an electrical conductivity corresponding to a voltage applied to the second gate electrode 223.

The second gate electrode 223 may include a same material as the first gate electrode. The second gate electrode 223 may be disposed on a layer same as the first gate electrode. For example, the second gate electrode 223 may be formed simultaneously with the first gate electrode.

The second drain electrode 225 may include a conductive material. For example, the second drain electrode 225 may include a metal, such as aluminum (Al), chrome (Cr), copper (Cu), molybdenum (Mo), titanium (Ti) and tungsten (W). The second drain electrode 225 may include a material different from the second gate electrode 223. The second drain electrode 225 may be disposed on a layer different from the second gate electrode 223. For example, the second drain electrode 225 may be insulated from the second gate electrode 223. The second drain electrode 225 may be electrically connected to the second drain region of the second semiconductor pattern 221.

The second drain electrode 225 may be disposed on a same layer as the first drain electrode. The second drain electrode 225 may include a same material as the first drain electrode. For example, the second drain electrode 225 may be formed simultaneously with the first drain electrode.

The second source electrode 227 may include a conductive material. For example, the second source electrode 227 may include a metal, such as aluminum (Al), chrome (Cr), copper (Cu), molybdenum (Mo), titanium (Ti) and tungsten (W). The second source electrode 227 may include a material different from the second gate electrode 223. The second source electrode 227 may be disposed on a layer different from the second gate electrode 223. For example, the second source electrode 227 may be disposed on a same layer as the second drain electrode 225. The second source electrode 227 may include a material same as the second drain electrode 225. The second source electrode 227 may be insulated from the second gate electrode 223. The second source electrode 227 may be electrically connected to the second source region of the second semiconductor pattern 221.

The second source electrode 227 may be disposed on a same layer as the first source electrode. The second source electrode 227 may include a same material as the first source electrode. For example, the second source electrode 227 may be formed simultaneously with the first source electrode.

The storage capacitor Cst may maintain a signal applied to the second gate electrode 223 of the second thin film transistor T2 for one frame. For example, the storage capacitor Cst may be electrically connected between the second gate electrode 223 and the second source electrode 227 of the second thin film transistor T2. The storage capacitor Cst may have a stacked structure of capacitor electrodes. The storage capacitor Cst may be formed by using a process of forming the first thin film transistor T1 and the second thin film transistor T2. For example, the storage capacitor Cst may have a stacked structure of a first capacitor electrode disposed a layer same as the second gate electrode 223, and a second capacitor electrode disposed on a layer same layer as the second source electrode.

A plurality of insulating layers 110, 120, 130, 140, 150 and 160 for preventing unnecessary electrical connection in each pixel area PA may be disposed on the device substrate 100. For example, a device buffer layer 110, a gate insulating layer 120, an interlayer insulating layer 130, a device passivation layer 140, a planarization layer 150 and a bank insulating layer 160 may be disposed on the device substrate 100.

The device buffer layer 110 may be disposed close to the device substrate 100. The device buffer layer 110 may prevent pollution due to the device substrate 100 in a process of forming the pixel driving circuit DC in each pixel area PA. For example, an upper surface of the device substrate 100 toward the pixel driving circuit DC of each pixel area PA may be completely covered by the device buffer layer 110. The device buffer layer 110 may include an insulating material. For example, the device buffer layer 110 may include an inorganic insulating material, such as silicon oxide (SiOx) and silicon nitride (SiNx). The device buffer layer 110 may include a multi-layer structure. For example, the device buffer layer 110 may have a stacked structure of an inorganic insulating layer made of silicon oxide (SiOx) and an inorganic insulating layer made of silicon nitride (SiNx).

The gate insulating layer 120 may be disposed on the device buffer layer 110. The gate insulating layer 120 may insulate the gate electrodes 223 of each pixel area PA from the corresponding semiconductor pattern 221. For example, the gate insulating layer 120 may cover the first semiconductor pattern and the second semiconductor pattern 223 of each pixel area PA. The first gate electrode and the second gate electrode 223 of each pixel area PA may be disposed on the gate insulating layer 120. The gate insulating layer 120 may include an insulating material. For example, the gate insulating layer 120 may include an inorganic insulating material, such as silicon oxide (SiOx).

The interlayer insulating layer 130 may be disposed on the gate insulating layer 120. The drain electrodes 225 and the source electrodes 227 of each pixel area PA may be insulated from the corresponding gate electrode 223 by the interlayer insulating layer 130. For example, the interlayer insulating layer 130 may cover the first gate electrode and the second gate electrode 223 of each pixel area PA. The first drain electrode, the first source electrode, the second drain electrode 225 and the second source electrode 227 of each pixel area PA may be disposed on the interlayer insulating layer 130. The interlayer insulating layer 130 may include an insulating material. For example, the interlayer insulating layer 130 may include an inorganic insulating material, such as silicon oxide (SiOx) and silicon nitride (SiNx).

The device passivation layer 140 may be disposed on the interlayer insulating layer 130. The device passivation layer 140 may prevent damage of the pixel driving circuit of each pixel area PA due to external moisture and impact. For example, the first drain electrode, the first source electrode, the second drain electrode 225 and the second source electrode 227 of each pixel area PA may be covered by the device passivation layer 140. The device passivation layer 140 may include an insulating material. For example, the device passivation layer 140 may be an inorganic insulating material, such as silicon oxide (SiOx) and silicon nitride (SiNx).

The planarization layer 150 may be disposed on the device passivation layer 140. The planarization layer 150 may remove a thickness difference due to the pixel driving circuit DC of each pixel area PA. For example, an upper surface of the planarization layer 150 opposite to the device substrate 100 may be a flat surface. The planarization layer 150 may include an insulating material. The planarization layer 150 may include a material different from the device passivation layer 140. For example, the planarization layer 150 may include an organic insulating material.

The light-emitting device 300 of each pixel area PA may be disposed on the planarization layer 150. The light-emitting device 300 of each pixel area PA may emit light displaying a specific color. For example, the light-emitting device 300 of each pixel area PA may include a first electrode 310, a light-emitting layer 320 and a second electrode 330, which sequentially are stacked on the planarization layer 150 of the corresponding pixel area PA.

The first electrode 310 may include a conductive material. The first electrode 310 may include a material having a relatively high reflectance. For example, the first electrode 310 may be a metal, such as aluminum (Al) and silver (Ag). The first electrode 310 may have a multi-layer structure. For example, the first electrode 310 may have a structure in which a reflective electrode made of a metal is disposed between transparent electrodes made of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. A transmittance of the second electrode 330 may be higher than a transmittance of the first electrode 310. For example, the second electrode 330 may be a transparent electrode made of a transparent conductive material, such as ITO and IZO, or a translucent electrode in which metals such as Ag and Mg are thinly formed. Thus, in the display apparatus according to the embodiment of the present disclosure, the light generated by the light-emitting layer 320 may be emitted outside through the second electrode 330.

The light-emitting device 300 of each pixel area PA may be electrically connected to the pixel driving circuit DC in the corresponding pixel area PA. For example, the second source electrode 227 of each pixel area PA may be electrically connected to the first electrode 310 of the corresponding pixel area PA. The passivation layer 140 and the planarization layer 150 may include electrode contact holes partially exposing the second drain electrode 227 of each pixel area PA. The first electrode 131 of each light-emitting device 130 may be in direct contact with the second drain electrode 127 of the corresponding pixel area PA through one of the electrode contact holes. The first electrode 310 of each pixel area PA may be in direct contact with the upper surface of the planarization layer 150. Thus, in the display apparatus according to the embodiment of the present invention, luminance deviation according to a generation position of the light emitted from each light-emitting device 300 may be prevented.

The bank insulating layer 160 may be disposed on the planarization layer 150. The bank insulating layer 160 may define an emission area EA in each pixel area PA. For example, the bank insulating layer 160 may cover an edge of the first electrode 310 in each pixel area PA. The light-emitting layer 320 and the second electrode 330 of each pixel area PA may be sequentially stacked on a portion of the corresponding first electrode 310 exposed by the bank insulating layer 160. The bank insulating layer 160 may include an insulating material. For example, the bank insulating layer 160 may be an organic insulating layer including an organic insulating material. The bank insulating layer 160 may include a material different from the planarization layer 150. The first electrode 310 of each pixel area PA may be insulated from the first electrode 310 of adjacent pixel area PA by the bank insulating layer 160.

Each of the pixel area PA may realize a color different from adjacent pixel area PA. For example, the light-emitting layer 320 of each pixel area PA may be spaced apart from the light-emitting layer 320 of adjacent pixel area PA. The light-emitting layer 320 of each pixel area PA may include an end on the bank insulating layer 160. The light-emitting layer 320 of each pixel area PA may be formed, individually. For example, the light-emitting layer 320 of each pixel area PA may be formed by a fine metal mask (FMM). A spacer may be disposed on the bank insulating layer 160. The spacer may prevent damage of the bank insulating layer 160 and the light-emitting layer 320 in adjacent pixel area PA due to the fine metal mask. The spacer may include an insulating material. For example, the spacer may include an organic insulating material. The spacer may include a same material as the bank insulating layer 160. For example, the bank insulating layer 160 and the spacer may be formed simultaneously by a patterning process using a half-tone mask. The end of the light-emitting layer 320 in each pixel area PA may be spaced apart from the spacer.

A voltage applied to the second electrode 330 of each pixel area PA may be a same as a voltage applied to the second electrode 330 of adjacent pixel area PA. For example, the second electrode 330 of each pixel area PA may be electrically connected to the second electrode 330 of adjacent pixel area PA. The second electrode 330 of each pixel area PA may include a same material as the second electrode 330 of adjacent pixel area PA. For example, the second electrode 330 of each pixel area PA may be formed simultaneously with the second electrode 330 of adjacent pixel area PA. The second electrode 330 of each pixel area PA may be in direct contact with the second electrode 330 of adjacent pixel area PA. For example, the second electrode 330 of each pixel area PA may extend on the bank insulating layer 160. Thus, in the display apparatus according to the embodiment of the present disclosure, a process of forming the second electrode 330 in each pixel area PA may be simplified. And, in the display apparatus according to the embodiment of the present disclosure, the luminance of the light emitted from the light-emitting device 300 of each pixel area PA may be adjusted by the data signal applied to the pixel driving circuit DC of the corresponding pixel area PA.

An encapsulation unit 400 may be disposed on the light-emitting device 300 of each pixel area PA. The encapsulation unit 400 may prevent damage of the light-emitting devices 300 due to external moisture and impact. For example, the light-emitting device 300 of each pixel area PA may be completely covered by the encapsulation unit 400. The encapsulation unit 400 may have a multi-layer structure. For example, the encapsulation unit 400 may include a first encapsulating layer 410, a second encapsulating layer 420 and a third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may be an inorganic insulating layer made of an inorganic insulating material, and the second encapsulating layer 420 may be an organic insulating layer made of an organic insulating material. Thus, in the display apparatus according to the embodiment of the present disclosure, the damage of the light-emitting devices 300 due to the external moisture and impact may be effectively prevented.

A viewing angle control unit 500 may be disposed on the encapsulation unit 400. The viewing angle control unit 500 may limit a traveling direction of the light emitted from the light-emitting device 300 of each pixel area PA. For example, the viewing angle control unit 500 may include a first black matrix 510 and a second black matrix 520 disposed on the first black matrix 510.

The second black matrix 520 may overlap the first black matrix 510. For example, the first black matrix 510 may be disposed between the encapsulation unit 400 and the second black matrix 520. Each of the first black matrix 510 and the second black matrix 520 may include openings **510*h* and 520*h* overlapping with the emission area EA of each pixel area PA. In one embodiment, the emission area EA may correspond to where the first electrode 310, the light-emitting layer 320, and the second electrode 330 overlap to emit light. Thus, each of the openings 510*h* and 520*h* may overlap with the light-emitting device 300 in a direction where light is emitted. For example, the first black matrix 510 may include first openings 510*h* overlapping with the emission area EA of each pixel area PA defined by the bank insulating layer 160, and the second black matrix 520 may include second openings 520*h* overlapping with the first openings 510*h*. The light generated by the light-emitting device of each pixel area PA may be emitted outside through one of the first openings 510*h* and one of the second openings 520*h*. The light emitted toward the outside of the corresponding emission area EA from the light-emitting device 300 of each pixel area PA may be blocked by the first black matrix 510 and the second black matrix 520. Thus, the image realized by the display apparatus according to the embodiment of the present disclosure may be not recognized by people around the user by the first black matrix 510 and the second black matrix 520**. That is, in the display apparatus according to the embodiment of the present disclosure, a narrow viewing angle may be realized.

A size **500*w* of the first opening 510*h* in each pixel area PA may be the same as a size of the emission area EA defined in the corresponding pixel area PA. The second opening 520*h* of each pixel area PA may have a size same as the size 500*w* of the first opening 510*h* of the corresponding pixel area PA. For example, the emission area EA of each pixel area PA may be disposed outside the first black matrix 510 and the second black matrix 520. The first black matrix 510 and the second black matrix 520 may overlap the bank insulating layer 160. The first black matrix 510 and the second black matrix 520** may not overlap the emission area EA of each pixel area PA.

The viewing angle control unit 500 may include a control insulating layer 530 between the first black matrix 510 and the second black matrix 520. For example, the control insulating layer 530 may cover the first black matrix 510. The second black matrix 520 may be disposed on the control insulating layer 530. The control insulating layer 530 may include a region overlapping with the emission areas EA. For example, the light passing through the first opening 510*h* of each pixel area PA may travel to the second opening 520*h* of the corresponding pixel area PA by passing through the control insulating layer 530. The control insulating layer 530 may include a material having a high transmittance.

The control insulating layer 530 may include an insulating material. For example, the control insulating layer 530 may include an organic insulating material. A thickness difference due to the first black matrix 510 may be removed by the control insulating layer 530. A lower surface of the second black matrix 520 toward the device substrate 100 may be in direct contact with the control insulating layer 530. For example, the lower surface of the second black matrix 520 may be a flat. Thus, in the display apparatus according to the embodiment of the present disclosure, position deviation of the second black matrix 520 due to the first black matrix 510 may be prevented. That is, in the display apparatus according to the embodiment of the present disclosure, a distance between the second opening 520*h* of the second black matrix 520 and the device substrate 100 in each pixel area PA may be substantially the same. Therefore, in the display apparatus according to the embodiment of the present disclosure, a luminance deviation according to a viewing angle and/or an azimuth angle due to a position deviation of the second black matrix 520 may be prevented.

An optical unit 600 may be disposed on the viewing angle control unit 500. The optical unit 600 may include a plurality of optical lens 610. The optical lenses 610 may be disposed side by side on the viewing angle control unit 500. For example, each of the optical lenses 610 may be disposed on one of the pixel areas PA. The optical lenses 610 may concentrate the light emitted from the light-emitting device 300 of each pixel area PA. For example, a surface of each optical lens 610 opposite to the device substrate 100 may be a semicircular shape. The optical lens 610 on each pixel area PA may overlap the emission area EA defined in the corresponding pixel area PA. For example, the optical lens 610 of each pixel area PA may overlap the first opening 510*h* and the second opening 520*h* of the corresponding pixel area PA. For example, the light passing through the first opening 510*h* and the second opening 520*h* of each pixel area PA may be concentrated by the optical lens 610 of the corresponding pixel area PA.

The optical lens 610 of each pixel area PA may have a size larger than the emission area EA defined in the corresponding pixel area PA. For example, the second black matrix 520 may include a region between the control insulating layer 530 and an edge of each optical lens 610. A size of the optical lens 610 in each pixel area PA may be larger than a size of the second opening 520*h* in the corresponding pixel area PA. Thus, in the display apparatus according to the embodiment of the present disclosure, all light passing through the second opening 520*h* of each pixel area PA may be concentrated by the optical lens 610 of the a PA. Therefore, in the display corresponding pixel area apparatus according to the embodiment of the present disclosure, the front luminance and the light-extraction efficiency of each pixel area PA may be improved.

The optical unit 600 may include a lens passivation layer 620 on the optical lenses 610. The lens passivation layer 620 may prevent the damage of the optical lenses 610 due to the external impact. For example, each of the optical lenses 610 may be completely covered by the lens passivation layer 620. The surface of each optical lens 610 having a semicircular shape may be in direct contact with the lens passivation layer 620. The lens passivation layer 620 may include an insulating material. For example, the lens passivation layer 620 may include an organic insulating material. A thickness difference due to the optical lenses 610 may be removed by the lens passivation layer 620. For example, an upper surface of the lens passivation layer 620 opposite to the device substrate 100 may be a flat surface.

The lens passivation layer 620 may have a refractive index equal to or greater than that of each optical lens 610. Thus, in the display apparatus according to the embodiment of the present disclosure, the reflection of the light passing through each optical lens 610 due to a difference in refractive index between the corresponding optical lens 610 and the lens passivation layer 620 may be prevented. For example, in the display apparatus according to the embodiment of the present disclosure, the light passing through each optical lens 610 may be not reflected toward the device substrate 100 at a boundary surface between the corresponding optical lens 610 and the lens passivation layer 620. Therefore, in the display apparatus according to the embodiment of the present disclosure, decreasing the light-extraction efficiency due to a difference in refractive index may be prevented.

A plurality of control grooves 530*g* may be disposed at an upper surface of the control insulating layer 530 toward the optical unit 600. In one embodiment, the grooves 530*g* may each be a recessed portion in the control insulating layer 530 or any insulating layer that is recessed in a direction toward the substrate 100. For example, the recessed portion of the groove 530*g* may be a concave part formed in the insulating layer. Each of the control groove 530*g* may overlap one of the optical lenses 610. For example, the control grooves 530*g* may overlap the emission areas EA. Each of the control groove 530*g* may be disposed in one of the second openings 520*h*. For example, the control groove 530*g* of each pixel area PA may have a size same as the second opening 520*h* of the corresponding pixel area PA at the upper surface of the control insulating layer 530. A surface of each control groove 530*g* toward the device substrate 100 may include a first bottom inclined in a first direction and a second bottom surface 532*bs* inclined in a second direction. The second direction may be different from the first direction. For example, the second bottom surface 532*bs* of the control groove 530*g* in each pixel area PA may be symmetrical with the first bottom surface 531*bs* of the corresponding control groove 530*g* with respect to a center of the emission area EA defined in the corresponding pixel area PA. A size of each control groove 530*g* may decrease toward the device substrate 100. For example, a first width of the recessed portion of the control groove 530*g* from a first distance from the device substrate 100 may be wider than a second width of the recessed portion of the control groove 530*g* from a second distance smaller than a first distance from the device substrate 100.

Each of the control groove 530*g* may be filled by at least a portion of one of the optical lenses 610. For example, the optical lens 610 of each pixel area PA may include a region disposed in the control groove 530*g* of the corresponding pixel area PA. Thus, in the display apparatus according to the embodiment of the present disclosure, the light L passing through the first opening 510*h* of each pixel area PA may be refracted toward a center of the emission area EA defined in the corresponding pixel area PA by the first bottom surface 531*bs* or the second bottom surface 532*bs* of the control groove 530*g* on the corresponding pixel area PA. For example, in the display apparatus according to the embodiment of the present disclosure, the light L passing through the first opening 510*h* of each pixel area PA may be primarily refracted at the boundary surface between the control groove 530*g* and the optical lens 610 of the corresponding pixel area PA, and be secondary refracted at a boundary surface between the optical lens 610 and the lens passivation layer 620 of the corresponding pixel area PA. Therefore, in the display apparatus according to the embodiment of the present disclosure, the amount of the light passing through the second opening 520*h* of each pixel area PA may be increased. And, in the display apparatus according to the embodiment of the present disclosure, the luminance deviation according to emitting position of the light L passing through the first opening 510*h* of each pixel area PA may be mitigated by the first bottom surface 531*bs* and the second bottom surface 532*bs* of the control groove 530*g* on the corresponding pixel area PA. That is, in the display apparatus according to the embodiment of the present disclosure, the luminance deviation according to a viewing angle and/or an azimuth angle due to misalignment of the light-emitting device 300 and the viewing angle control unit 500 in each pixel area PA may be mitigated.

Each of the optical lenses 610 may have a refractive index different from the control insulating layer 530. For example, a refractive index of each optical lens 610 may be greater than a refractive index of the control insulating layer 530. Thus, in the display apparatus according to the embodiment of the present disclosure, the reflection of the light passing through the first opening 510*h* of each pixel area PA due to a difference in refractive index between the control insulating layer 530 and the optical lens 610 of the corresponding pixel area PA may be prevented. For example, in the display apparatus according to the embodiment of the present disclosure, the light passing through the first opening 510*h* of each pixel area PA may be not reflected toward the device substrate 100 at a boundary surface between the optical lens 610 of the corresponding pixel area PA and the control insulating layer 530. Therefore, in the display apparatus according to the embodiment of the present disclosure, decreasing the light-extraction efficiency due to a difference in refractive index may be prevented.

FIGS. 5 to 9 are views sequentially showing a method of forming the display apparatus according to the embodiment of the present disclosure.

Figure 5:
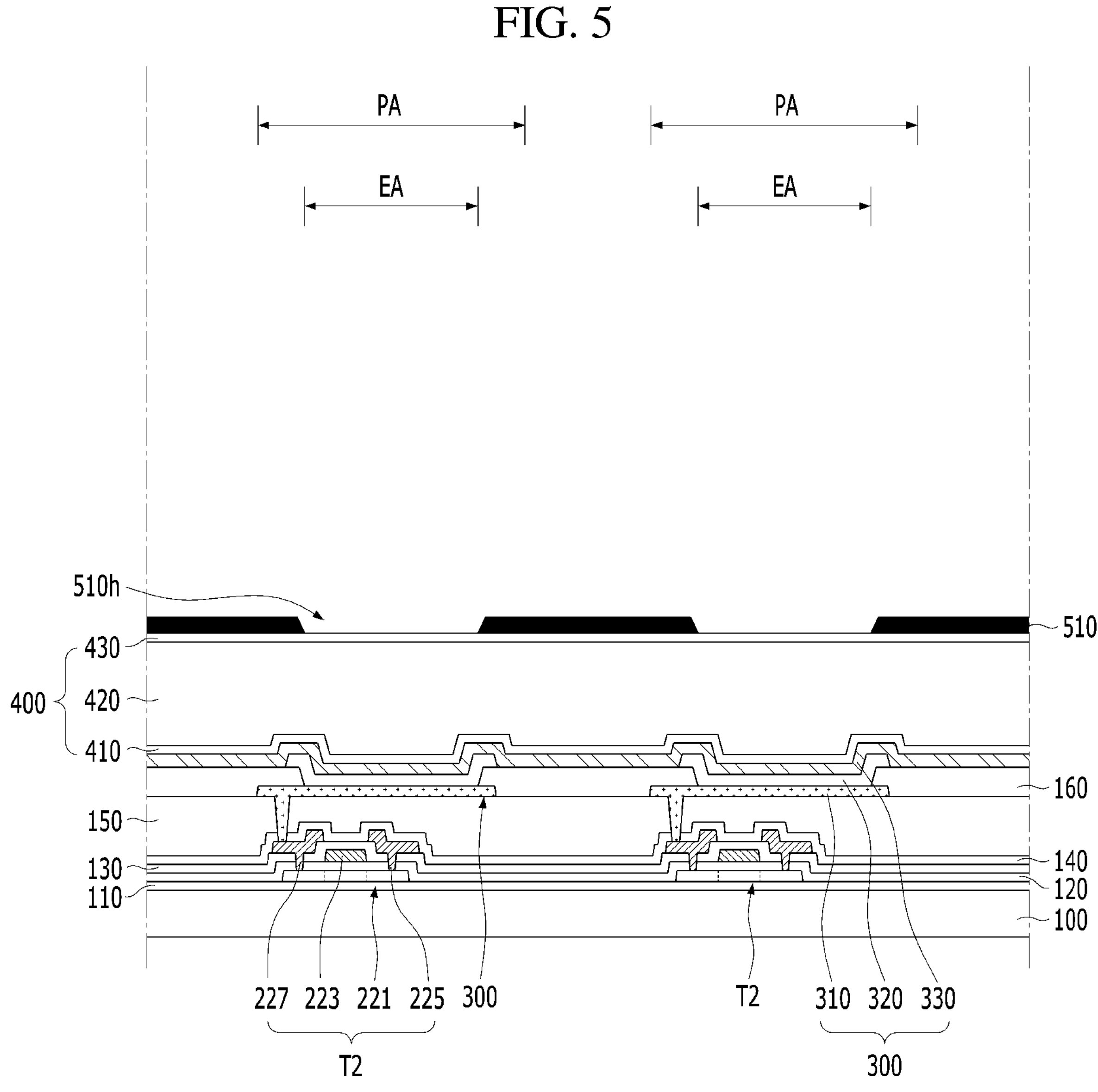

The method of forming the display apparatus according to the embodiment of the present disclosure will be described with reference to FIGS. 3 to 9. First, the method of forming the display apparatus according to the embodiment of the present disclosure may include a step of forming the pixel driving circuit including the second thin film transistor T2 on each pixel area PA of the device substrate 100, a step of forming the planarization layer 50 covering the pixel driving circuit of each pixel area PA, a step of forming the first electrode 310 electrically connected to the second source electrode 227 of each pixel area PA on the planarization layer 150 of the corresponding pixel area PA, a step of forming the bank insulating layer 160 covering an edge of the first electrode 310 in each pixel area PA on the planarization layer 150, a step of forming the light-emitting layer 320 on the emission area EA of each pixel area PA defined by the bank insulating layer 160, a step of forming the second electrode 330 on the light-emitting layer 320 of each pixel area PA, a step of forming the encapsulation unit 400 on the second electrode 330 of each pixel area PA, and a step of forming the first black matrix 510 including the first openings 510*h* on the encapsulation unit 400, as shown in FIG. 5.

Each of the first openings 510*h* may be disposed on the emission area EA of one of the pixel areas PA. For example, the step of forming the first black matrix 510 may include a step of forming a light-blocking layer made of a light-blocking material on the encapsulation unit 400 and a step of forming the first openings 510*h* exposing the emission area EA of each pixel area PA by patterning the light-blocking layer.

Figure 6:
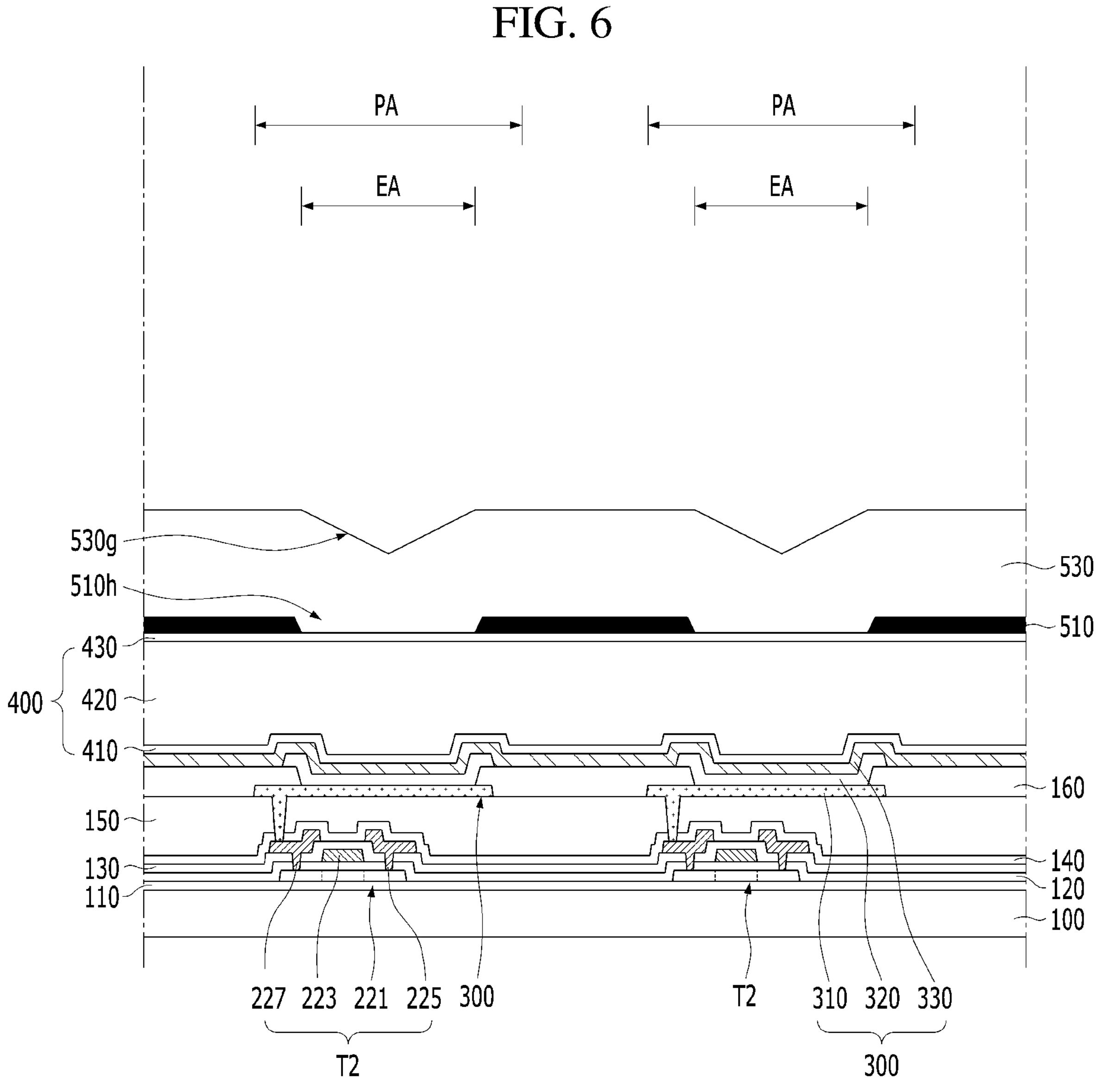

The method of forming the display apparatus according to the embodiment of the present disclosure may include a step of forming the control insulating layer 530 covering the first black matrix 510 and a step of forming the control grooves 530*g* at the upper surface of the control insulating layer 530, as shown in FIG. 6.

The control grooves 530*g* may overlap the first openings 510*h* of the first black matrix 510. For example, each of the control grooves 530*g* may be formed in the emission area EA of one of the pixel areas PA. The control groove 530*g* of each pixel area PA may be formed to have a same size as the first opening 510*h* of the corresponding pixel area PA at the upper surface of the control insulating layer 530.

A surface of each control groove 530*g* toward the device substrate 100 may be formed to be inclined. For example, each of the control grooves 530*g* may be formed to include the first bottom surface 531*bs* inclined in the first direction and the second bottom surface 532*bs* inclined in the second direction different from the first direction. A size of each control groove 530*g* may decrease toward the device substrate 100. For example, the control groove 530*g* of each pixel area PA may be formed to have a symmetrical shape with respect to a center of the emission area EA defined in the corresponding pixel area PA.

Figure 7:
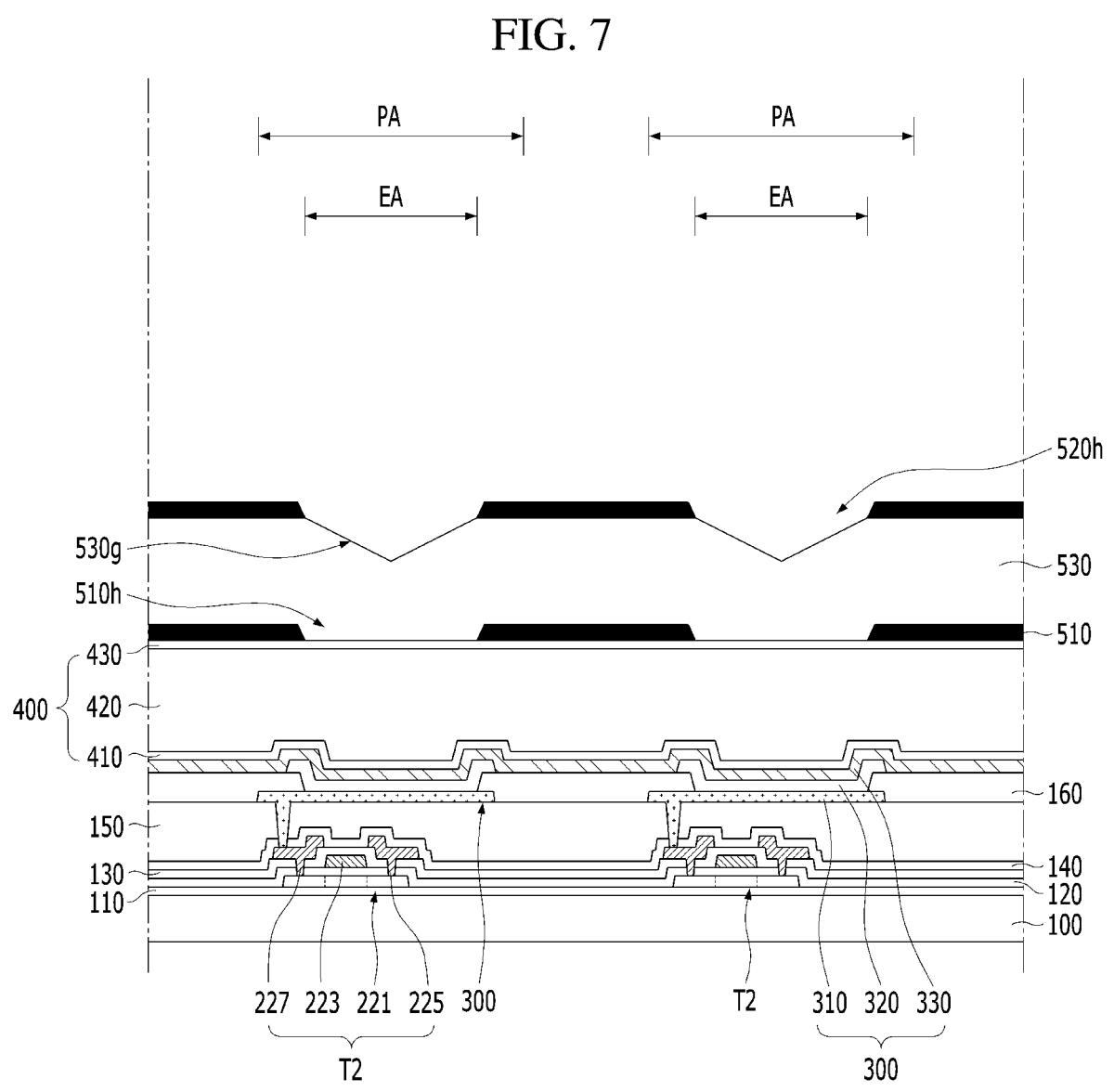

The method of forming the display apparatus according to the embodiment of the present disclosure may include a step of forming the second black matrix 520 including the second openings 520*h* on the control insulating layer 530, as shown in FIG. 7.

Each of the second openings 520*h* may be disposed on the emission area EA of one of the pixel areas PA. The second opening 520*h* of each pixel area PA may expose the control groove 530*h* of the corresponding pixel area PA. The second opening 520*h* of each pixel area PA may be formed at the upper surface of the control insulating layer 530 to have a same size as the control groove 530*g* of the corresponding pixel area PA. For example, the second black matrix 520 may be formed outside the control grooves 530*g*. The second black matrix 520 may be formed by a process same as the first black matrix 510. For example, the step of forming the second black matrix 520 may include a step of forming a light-blocking layer made of a light-blocking material on the control insulating layer 530 and a step of forming the second openings 520*h* exposing the control groove 530*g* of each pixel area PA by patterning the light-blocking layer.

Figure 8:
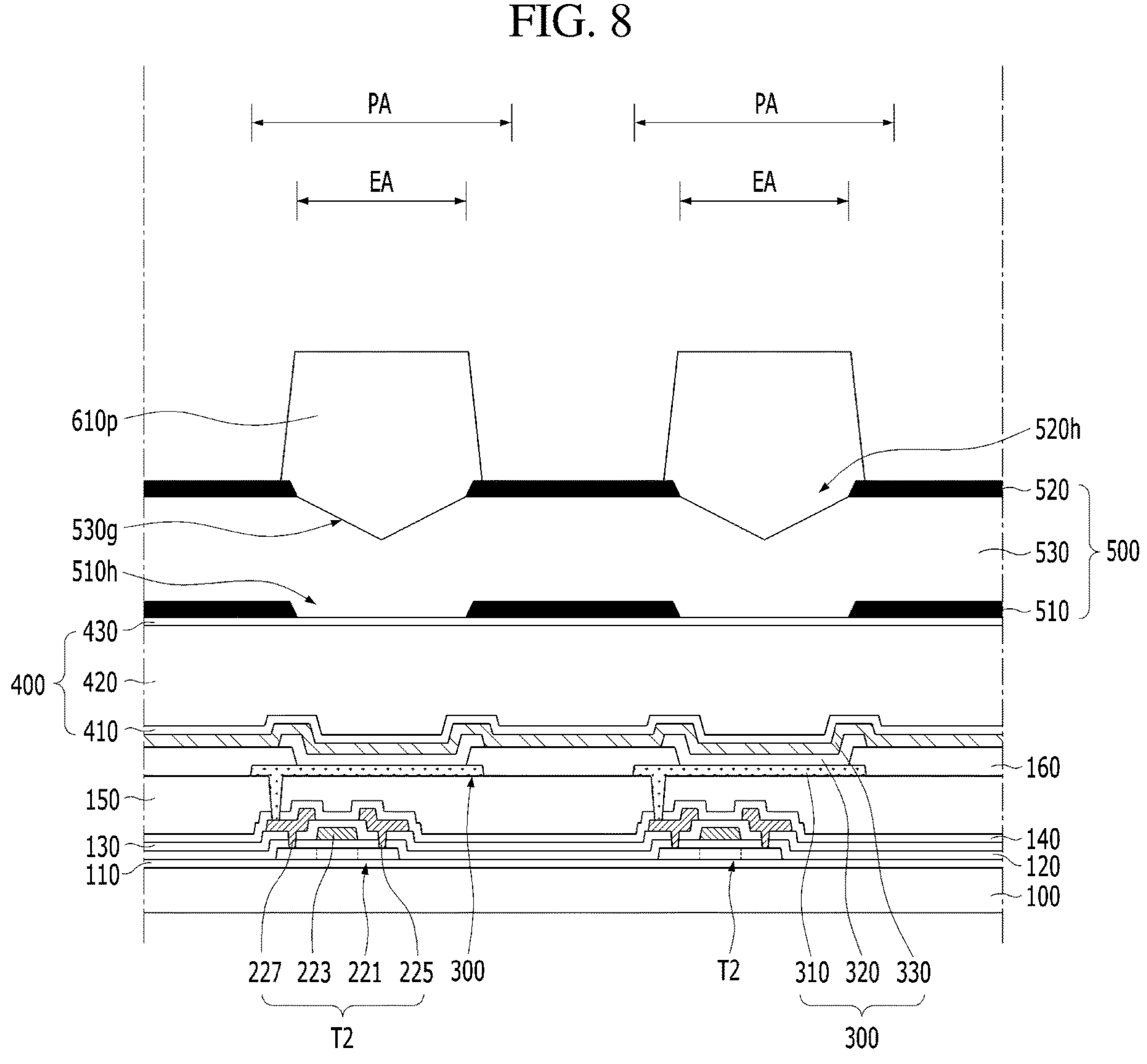

The method of forming the display apparatus according to the embodiment of the present disclosure may include a step of forming optical patterns 610*p* overlapping with the control grooves 530*g* on the device substrate 100 in which the second black matrix 520 is formed, as shown in FIG. 8.

The optical patterns 610*p* may be in direct contact with the control insulating layer 530 in the second openings 520*h* of the second black matrix 520. For example, each of the control grooves 530*g* may be filled by one of the optical patterns 610*p*. Each of the optical patterns 610*p* may be formed simultaneously with adjacent optical pattern 610*p*. For example, the step of forming the optical patterns 610*p* may include a step of forming an optical material layer filling the control grooves 530*g* on the device substrate 100 in which the second black matrix 520 is formed, and a step of patterning the optical material layer.

The optical material layer may be formed of a material having a refractive index different from the control insulating layer 530. For example, a refractive index of each optical pattern 610*p* may be greater than a refractive index of the control insulating layer 530. Thus, in the method of forming the display apparatus according to the embodiment of the present disclosure, the light passing through a boundary surface between each optical pattern 610*p* and the control insulating layer 530 may be refracted.

Figure 9:
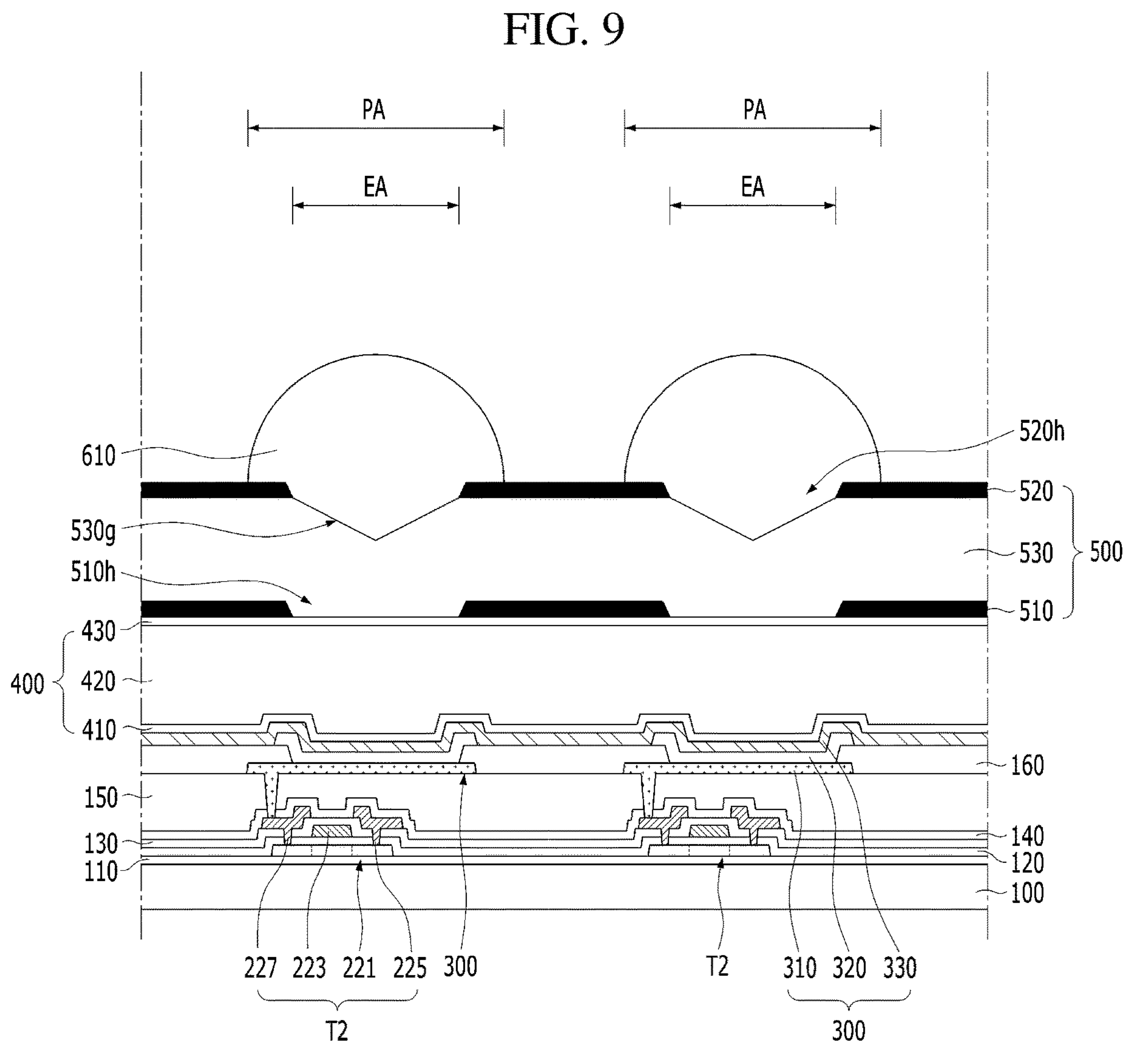

The method of forming the display apparatus according to the embodiment of the present disclosure may include a step of forming the optical lenses 610 on the second openings 520*h* of the second black matrix 520, as shown in FIG. 9.

The optical lenses 610 may be formed by using the optical patterns 610*p*. For example, the step of forming the optical lenses 610 may include a step of reflow the optical patterns 610*p*. A lower surface of each optical lens 610 toward the device substrate 100 may be a circle shape. A surface of each optical lens 610 opposite to the device substrate 100 may be a semicircular shape, a convex lens shape, a curved shape, and the like. Thus, in the method of forming the display apparatus according to the embodiment of the present disclosure, the optical lens 610 of each pixel area PA may be formed simultaneously. That is, in the method of forming the display apparatus according to the embodiment of the present disclosure, a process of forming the optical lens 610 on each pixel area PA may be simplified. Therefore, in the method of forming the display apparatus according to the embodiment of the present disclosure, the process efficiency may be improved. Moreover, in the process of performing reflow of the optical patterns 610*p*, the optical patterns 610*p* may undergo thermal treatment, decreasing the viscosity of the optical patterns 610*p*. Thus, the liquidity of the optical patterns 610*p* may be increased. The control grooves 530*g* may help improve fix the location of the optical patterns 610*p* to where each optical lens 610 should be formed, further enhancing the manufacturing process.

The method of forming the display apparatus according to the embodiment of the present disclosure may include a step of forming the lens passivation layer 620 covering the optical lenses 610, as shown in FIGS. 3 and 4.

The lens passivation layer 620 may be formed to completely cover the optical lenses 610. For example, the step of forming the lens passivation layer 620 may include a step of depositing an organic insulating material for forming the lens passivation layer 620 on the device substrate 100 in which the optical lenses 610 are formed.

Accordingly, the display apparatus according to the embodiment of the present disclosure may include the encapsulation unit 400 covering the light-emitting device 300 of each pixel area PA, the viewing angle control unit 500 on the encapsulation unit 400 and the optical lenses 610 on the viewing angle control unit 500, wherein the viewing angle control unit may include the control insulating layer 530 between the first black matrix 510 and the second black matrix 520, wherein the control insulating layer 530 of each pixel area PA may include the control groove 530*g* between the first opening 510*h* and the second opening 520*h* of the corresponding pixel area PA, and wherein the optical lens 610 of each pixel area PA may include a region disposed in the corresponding control groove 530*g* including the first bottom surface 531*bs* inclined in the first direction and the second bottom surface 532*bs* inclined in the second direction. Thus, in the display apparatus according to the embodiment of the present disclosure, the light L passing through the first opening 510*h* of each pixel area PA may be emitted, after being refracted at the boundary surface between the control groove 530*g* and the optical lens 610 of the corresponding pixel area PA and the boundary surface between the optical lens 610 and the lens passivation layer 620 of the corresponding pixel area PA. Therefore, in the display apparatus according to the embodiment of the present disclosure, the amount of the light emitted through the second opening 520*h* of each pixel area PA may be increased. That is, in the display apparatus according to the embodiment of the present disclosure, the light-extraction efficiency may be improved. And, in the display apparatus according to the embodiment of the present disclosure, the luminance deviation due to the misalignment of the light-emitting device 300 and the viewing angle control unit 500 of each pixel area PA may be mitigated.

Figure 10:
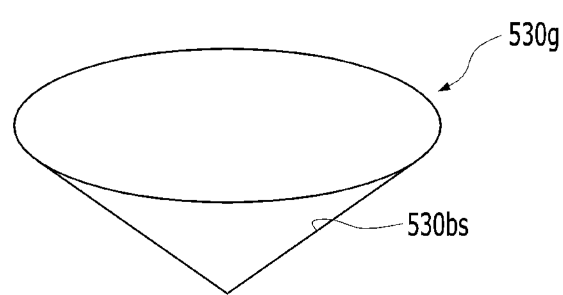
Figure 11:
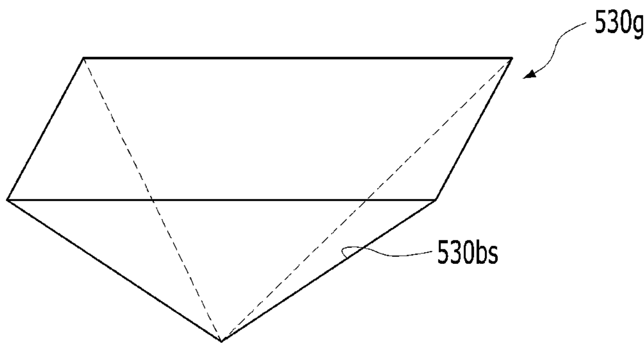

The display apparatus according to the embodiment of the present disclosure is described that the control groove 530*g* includes the first bottom surface 531*bs* and the second bottom surface 532*bs* of the recessed portion which are inclined in corresponding directions. However, in the display apparatus according to another embodiment of the present disclosure, each of the recessed portion of the control groove 530*g* may be formed in various shapes. For example, in the display apparatus according to another embodiment of the present disclosure, each of the control grooves 530*g* may be formed in a conical shape having an inclined surface 530*bs*, as shown in FIG. 10. In the display apparatus according to another embodiment of the present disclosure, a plane of each control groove 530*g* may have a shape different from the lower surface of each optical lens 610 at the upper surface of the control insulating layer 530. For example, in the display apparatus according to another embodiment of the present disclosure, each of the control grooves 530*g* may be formed in a pyramid shape, as shown in FIG. 11. Thus, in the display apparatus according to another embodiment of the present disclosure, the degree of freedom for a shape of each control groove 530*g* may be improved.

Figure 12:
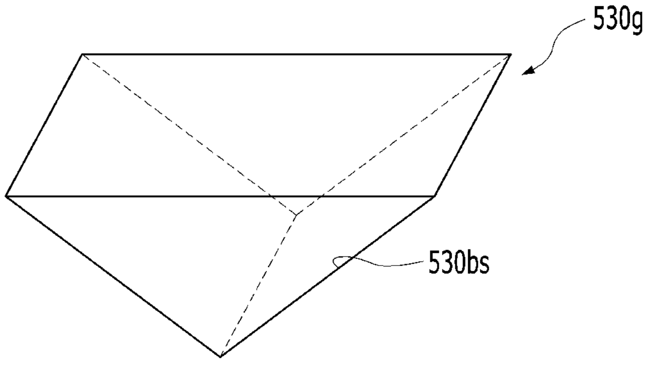

In the display apparatus according to another embodiment of the present disclosure, a cross-section of each control groove 530*g* may have various shapes. For example, in the display apparatus according to another embodiment of the present disclosure, each of the control grooves 530*g* may be a prism shape, as shown in FIG. 12. Thus, in the display apparatus according to another embodiment of the present disclosure, a cross-section of each control groove 530*g* in a third direction may have a shape different from a cross-section of each control groove 530*g* in a fourth direction different from the third direction. Therefore, in the display apparatus according to another embodiment of the present disclosure, the degree of freedom for a shape of each control groove 530*g* may be further improved.

Figure 13:
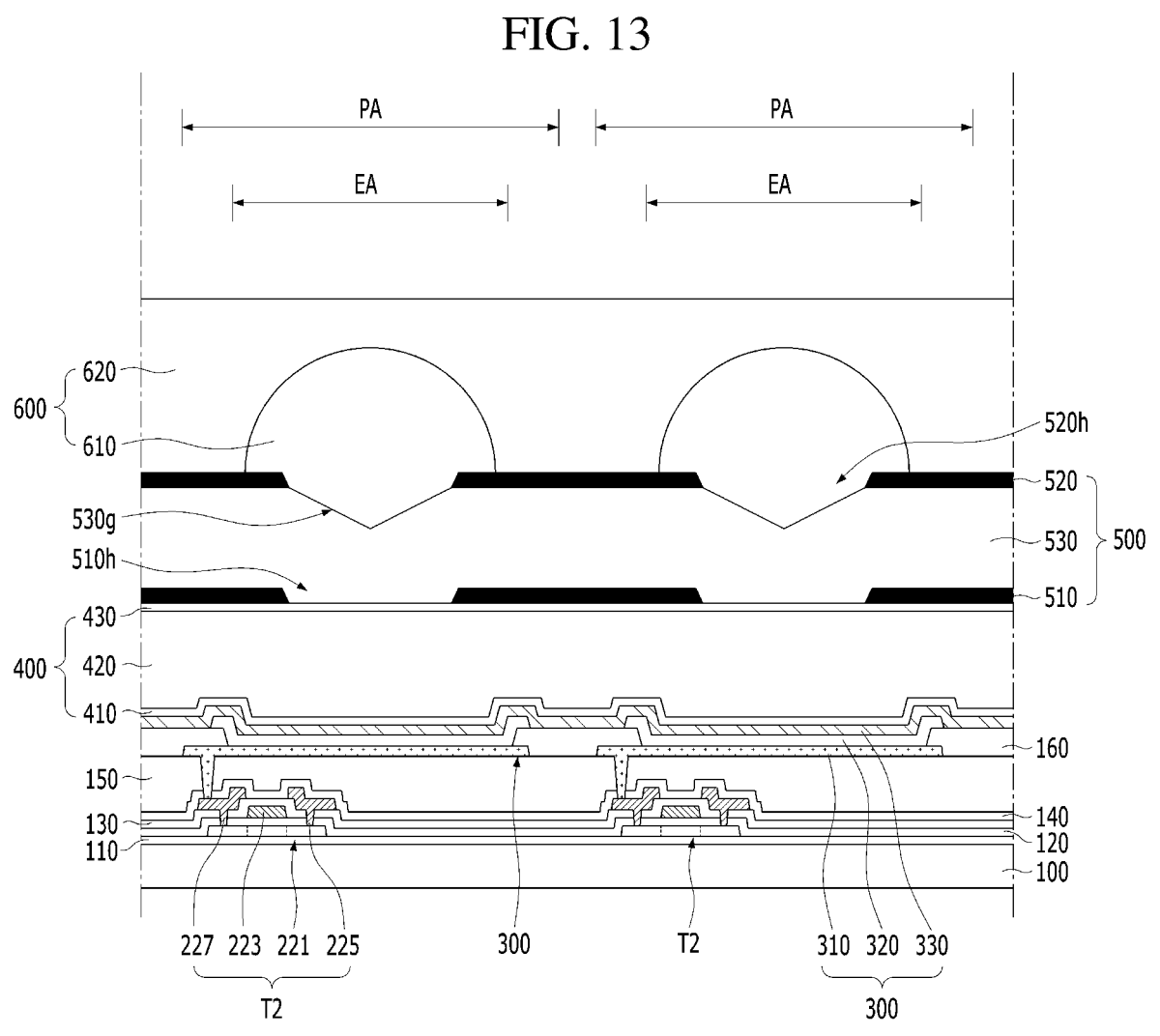

The display apparatus according to the embodiment of the present disclosure is described that the emission area EA of each pixel area PA has a size same as the first opening 510*h* and the second opening 520*h* of the corresponding pixel area PA. However, in the display apparatus according to another embodiment of the present disclosure, the emission area EA of each pixel area PA may have a size larger than the first opening 510*h* and the second opening 520*h* of the corresponding pixel area PA, as shown in FIG. 13. For example, each of the emission areas EA may overlap an edge of the first black matrix 510 and an edge of the second black matrix 520. Thus, in the display apparatus according to another embodiment of the present disclosure, the amount of the light refracted at the boundary surface between the control groove 530*g* and the optical lens 610 of each pixel area PA after passing through the first opening 510*h* of the corresponding pixel area PA may be increased. That is, in the display apparatus according to another embodiment of the present disclosure, the power consumption for the operation of the light-emitting device 300 in each pixel area PA may be reduced. Therefore, in the display apparatus according to another embodiment of the present disclosure, the lifetime of each light-emitting device 300 may be increased.

Figure 14:
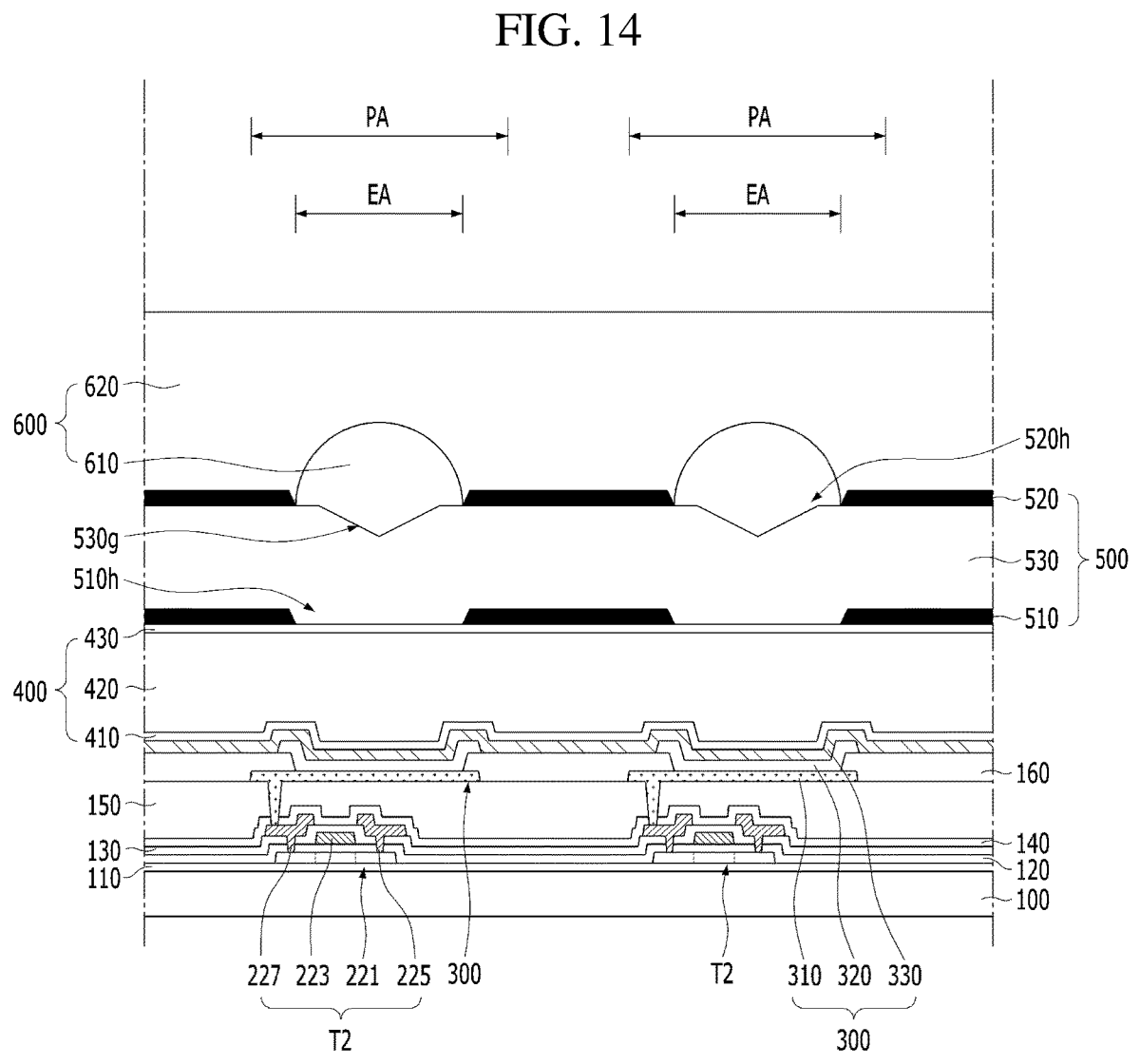

The display apparatus according to the embodiment of the present disclosure is described that the control groove 530*g* of each pixel area PA has a size same as the second opening 520*h* of the corresponding pixel area PA at the upper surface of the control insulating layer 530. However, in the display apparatus according to another embodiment of the present disclosure, a size of the control groove 530*g* in each pixel area PA may be different from a size of the second opening 520*h* of the corresponding pixel area PA at the upper surface of the control insulating layer 530. For example, in the display apparatus according to another embodiment of the present disclosure, the control groove 530*g* in each pixel area PA may have a size smaller than the second opening 520*h* of the corresponding pixel area PA at the upper surface of the control insulating layer 530, as shown in FIG. 14. The optical lens 610 in each pixel area PA may be disposed in the second opening 520*h* of the corresponding pixel area PA. For example, an edge of the optical lens 610 in each pixel area PA may be in direct contact with a side of the second opening 520*h* in the corresponding pixel area PA. That is, in the display apparatus according to another embodiment of the present disclosure, a forming location of the optical lenses 610 may be determined by the second openings 520*h* of the second black matrix 520. Therefore, an end or surface of the optical lens 610 may contact a side of the black matrix 520 exposed through the second opening 520*h*. Thus, in the display apparatus according to another embodiment of the present disclosure, a size deviation of the optical lenses 610 may be prevented.

Figure 15:
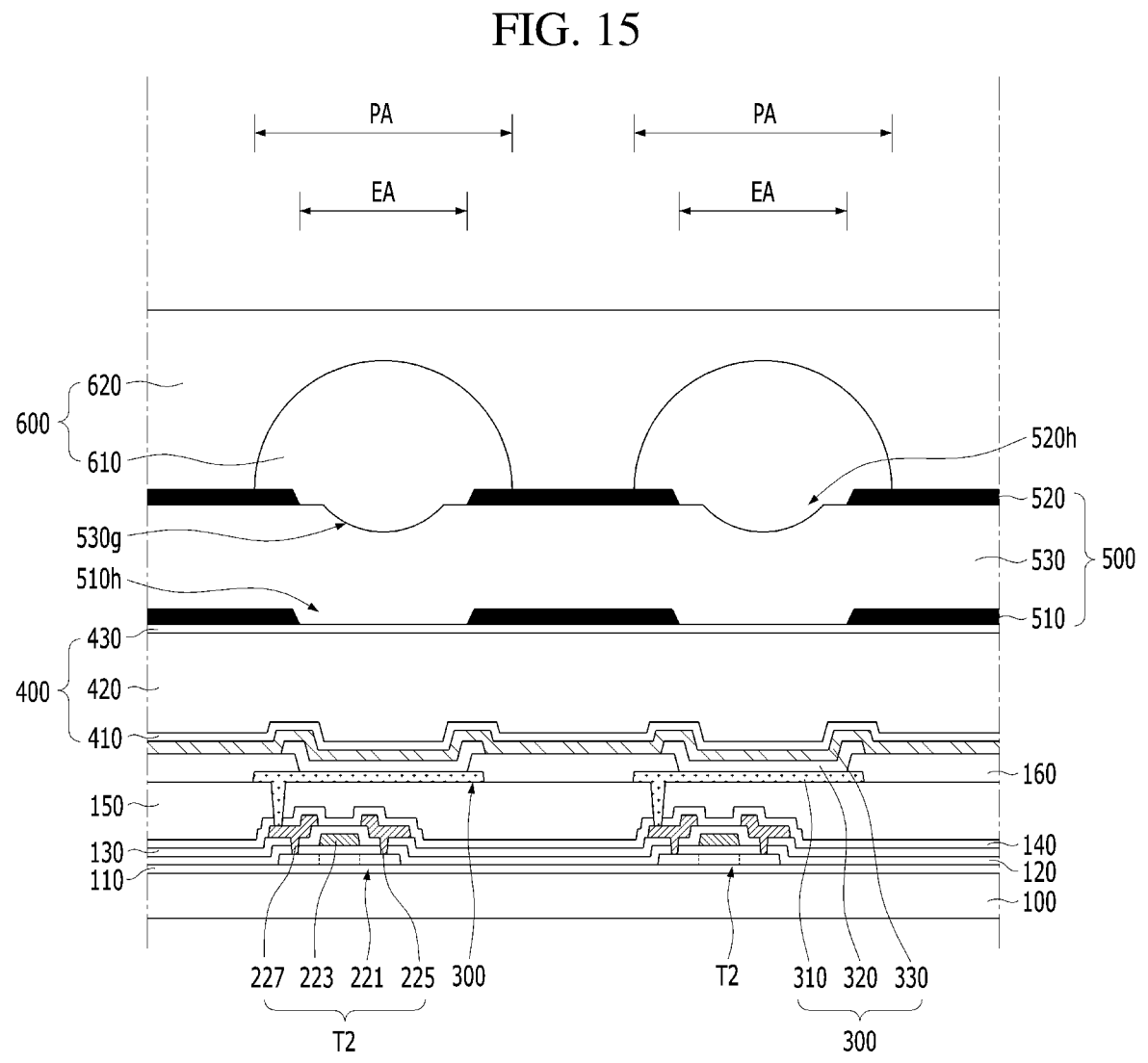

The display apparatus according to the embodiment of the present disclosure is described that a bottom surface 531*bs* and 532*bs* of each control groove 530*g* toward the device substrate 100 is an inclined surface. However, in the display apparatus according to another embodiment of the present disclosure, a bottom surface of the recessed portion of each control groove 530*g* may be a curved surface having a specific curvature, as shown in FIG. 15. Thus, in the display apparatus according to another embodiment of the present disclosure, the light incident on the bottom surface of each control groove 530*g* may be refracted in different directions according to incident position. Therefore, in the display apparatus according to another embodiment of the present disclosure, the luminance deviation of the light primary refracted by each groove control 530*g* may be mitigated. That is, in the display apparatus according to another embodiment of the present disclosure, the luminance deviation according to a viewing angle and/or an azimuth angle due to misalignment of the light-emitting device 300 and the viewing angle control unit 500 in each pixel area PA may be effectively mitigated.

Figure 16:
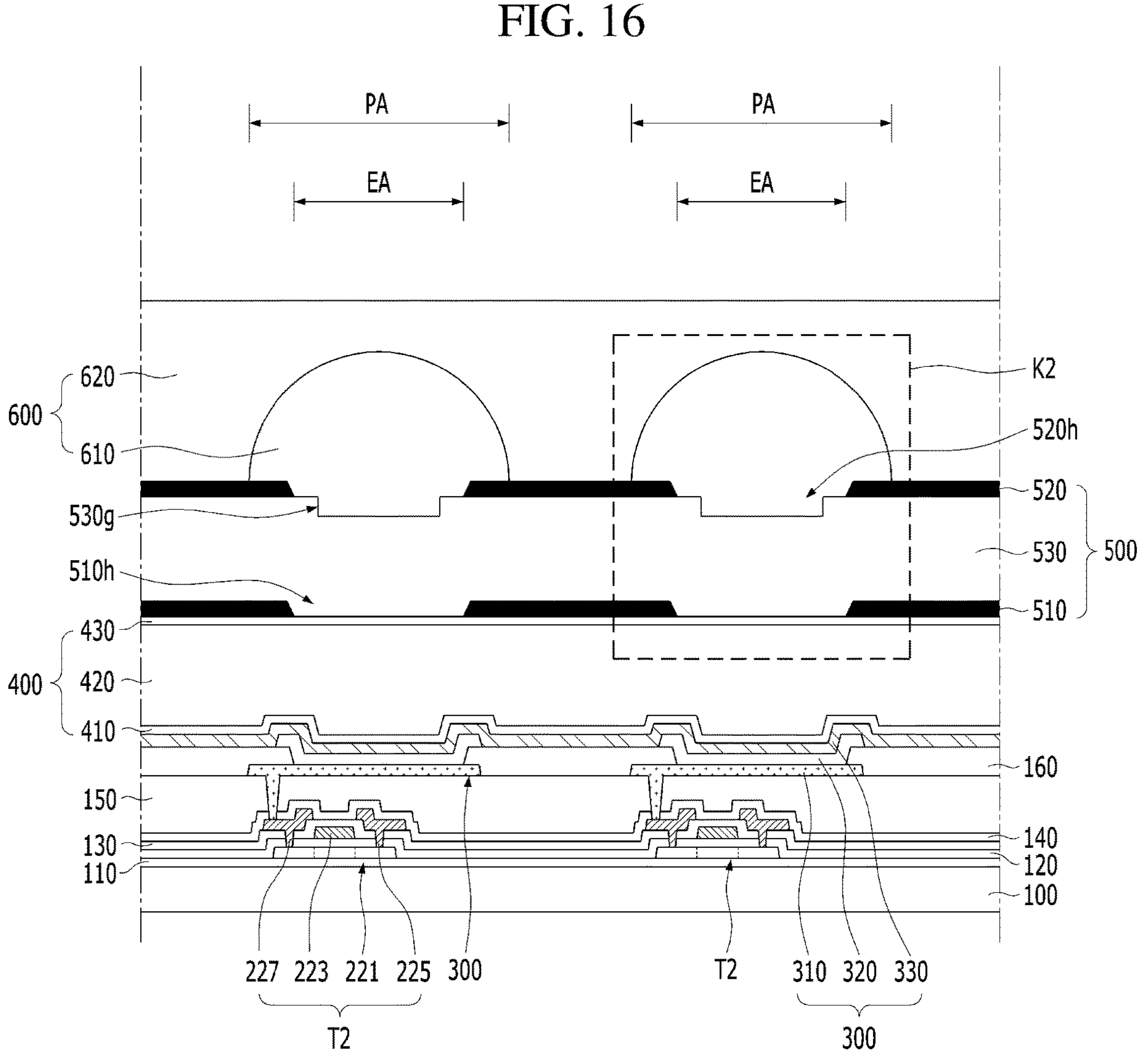
Figure 17:
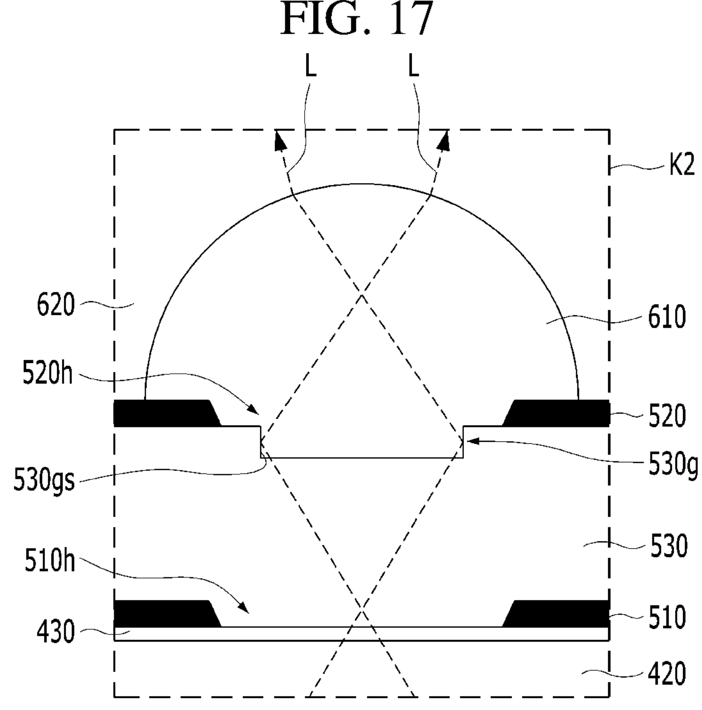

In the display apparatus according to another embodiment of the present disclosure, a bottom surface of each control groove 530*g* may be parallel to the upper surface of the control insulating layer 530 or may be substantially flat or a flat surface. For example, in the display apparatus according to another embodiment of the present disclosure, each of the control grooves 530*g* may include a side 530*gs* extending in a direction perpendicular to the upper surface of the control insulating layer 530 or the bottom surface of the control groove 530*g*, as shown in FIGS. 16 and 17. A refractive index of the optical lens 610 filling each control groove 530*g* may be larger than a refractive index of the control insulating layer 530. Thus, in the display apparatus according to another embodiment of the present disclosure, the light traveling toward the side 530*gs* of each control groove 530*g* may be reflected by a difference in refractive index between the optical lens 610 filling the corresponding control groove 530*g* and the control insulating layer 530. That is, in the display apparatus according to another embodiment of the present disclosure, the light incident on the side 530*gs* of each control groove 530*g* may be reflected toward the inside of the corresponding control groove 530*g*. Therefore, in the display apparatus according to another embodiment of the present disclosure, the light-extraction efficiency may be effectively improved. And, in the display apparatus according to another embodiment of the present disclosure, the luminance deviation due to misalignment may be effectively mitigated.

Figure 18:
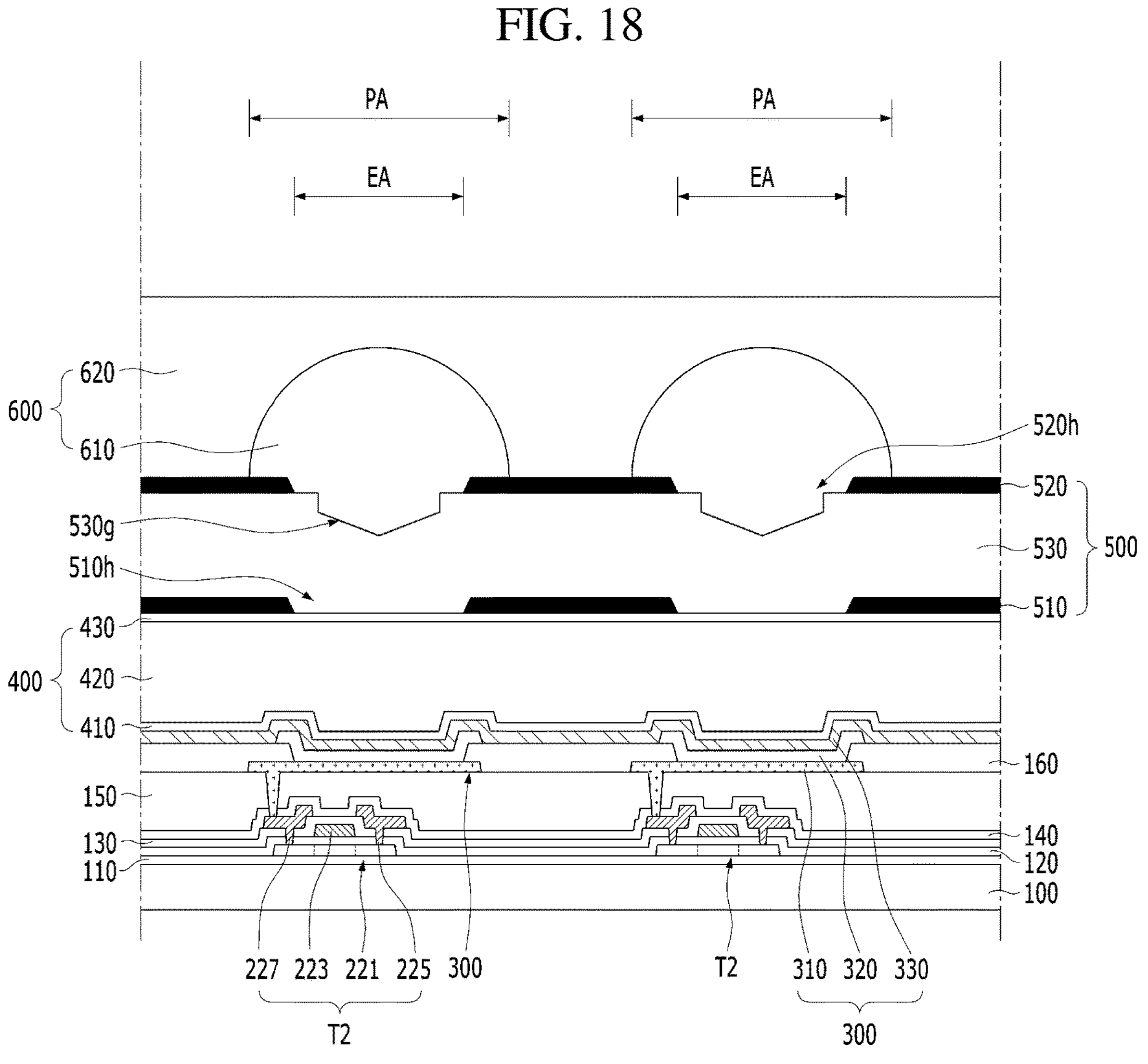
Figure 20:
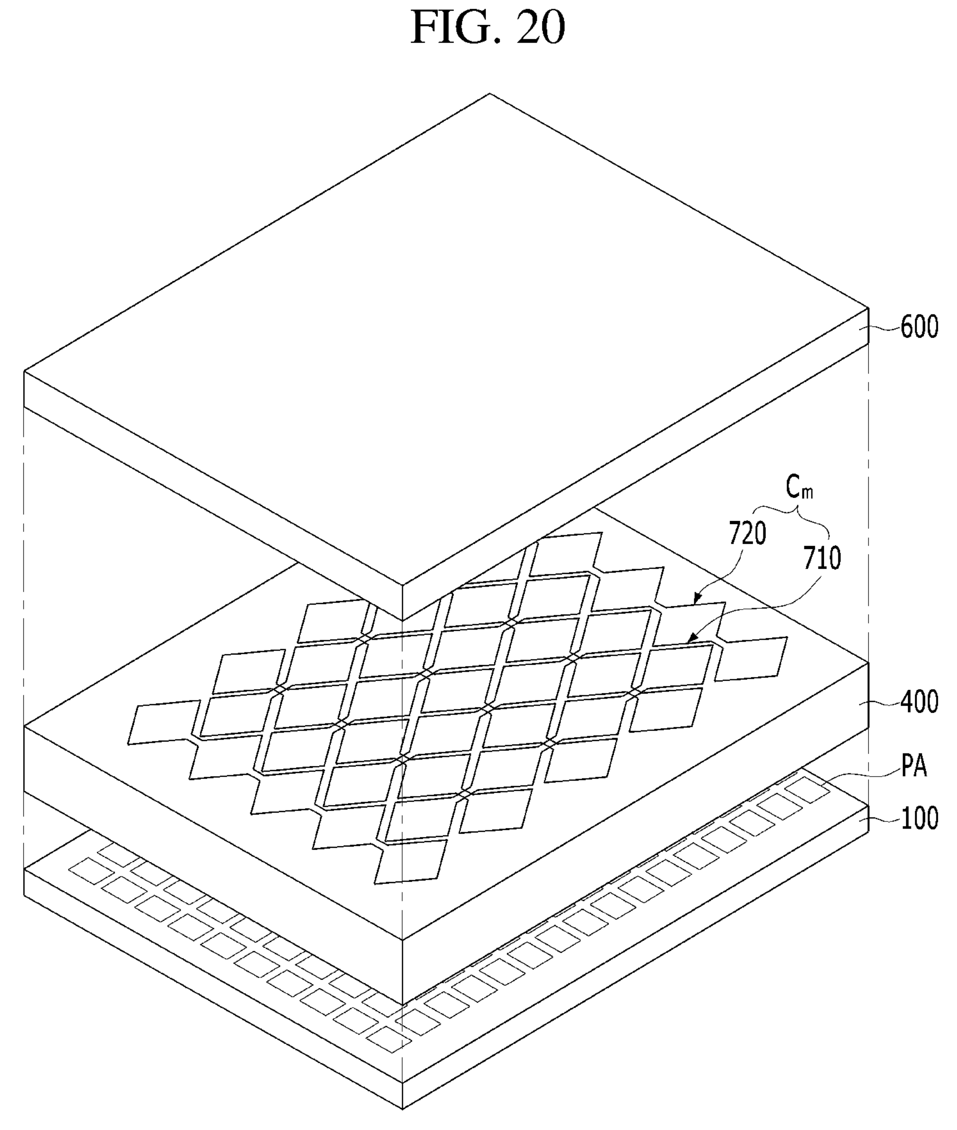
Figure 22:
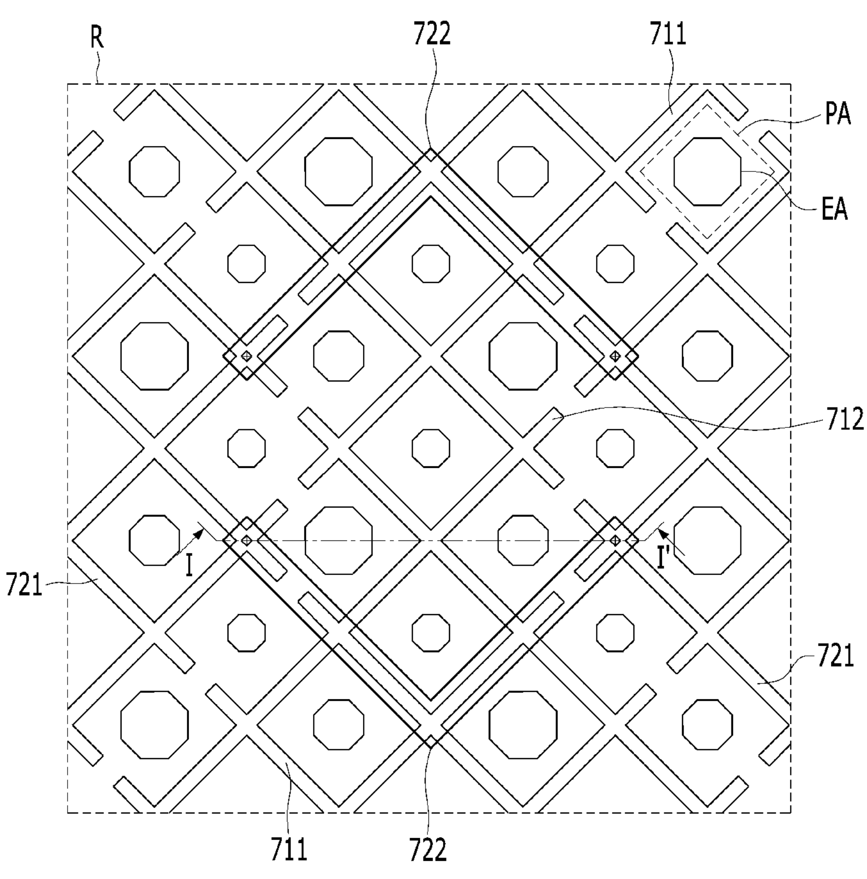
Figure 23:
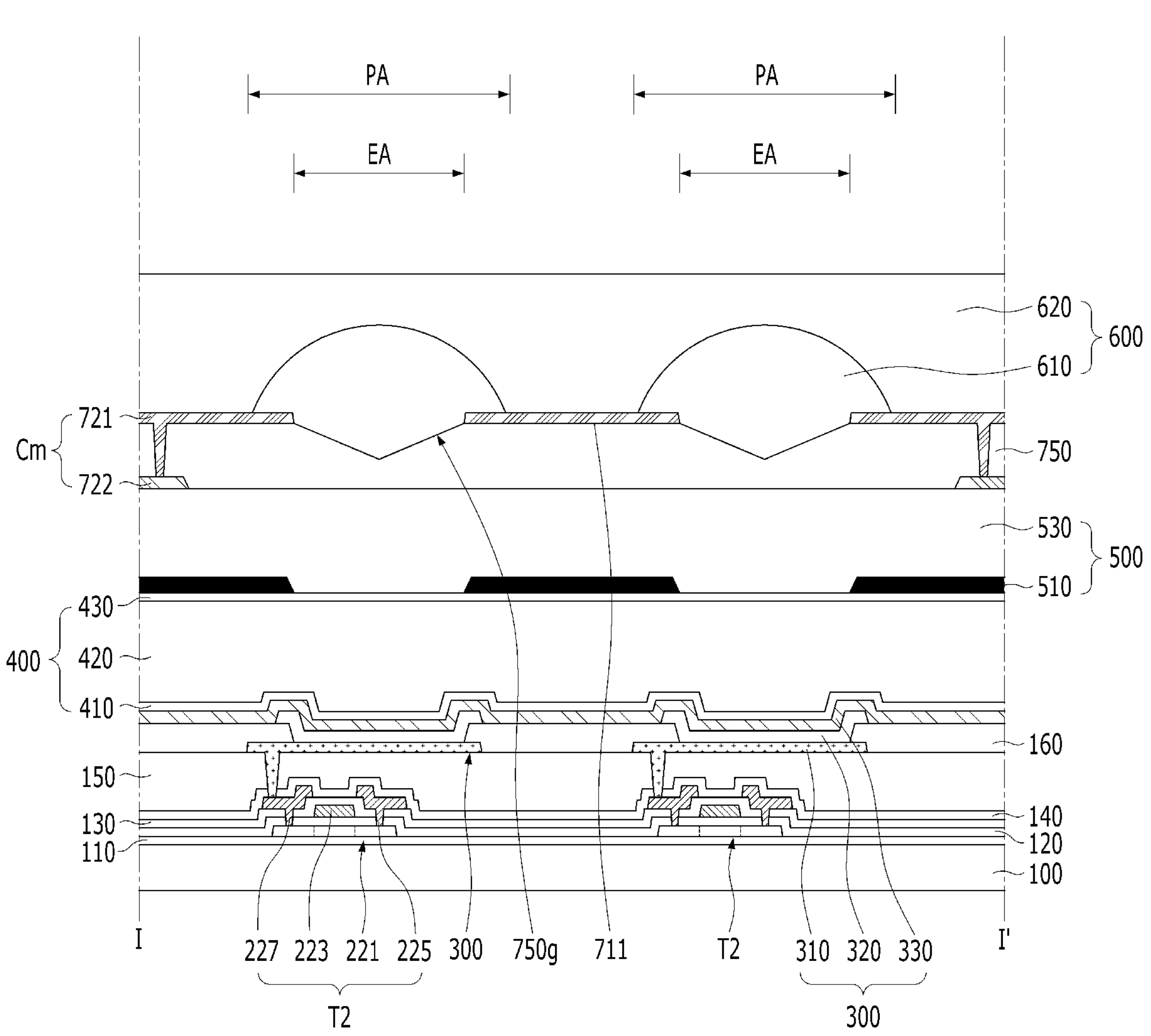

In the display apparatus according to another embodiment of the present disclosure, each of the control grooves 530*g* may include both an inclined bottom surface and a side extending in a direction perpendicular to the upper surface of the control insulating layer 530, as shown in FIG. 18. Therefore, in the display apparatus according to another embodiment of the present disclosure, the viewing angle may be limited, and the light-extraction efficiency may be effectively improved.

Figure 19:
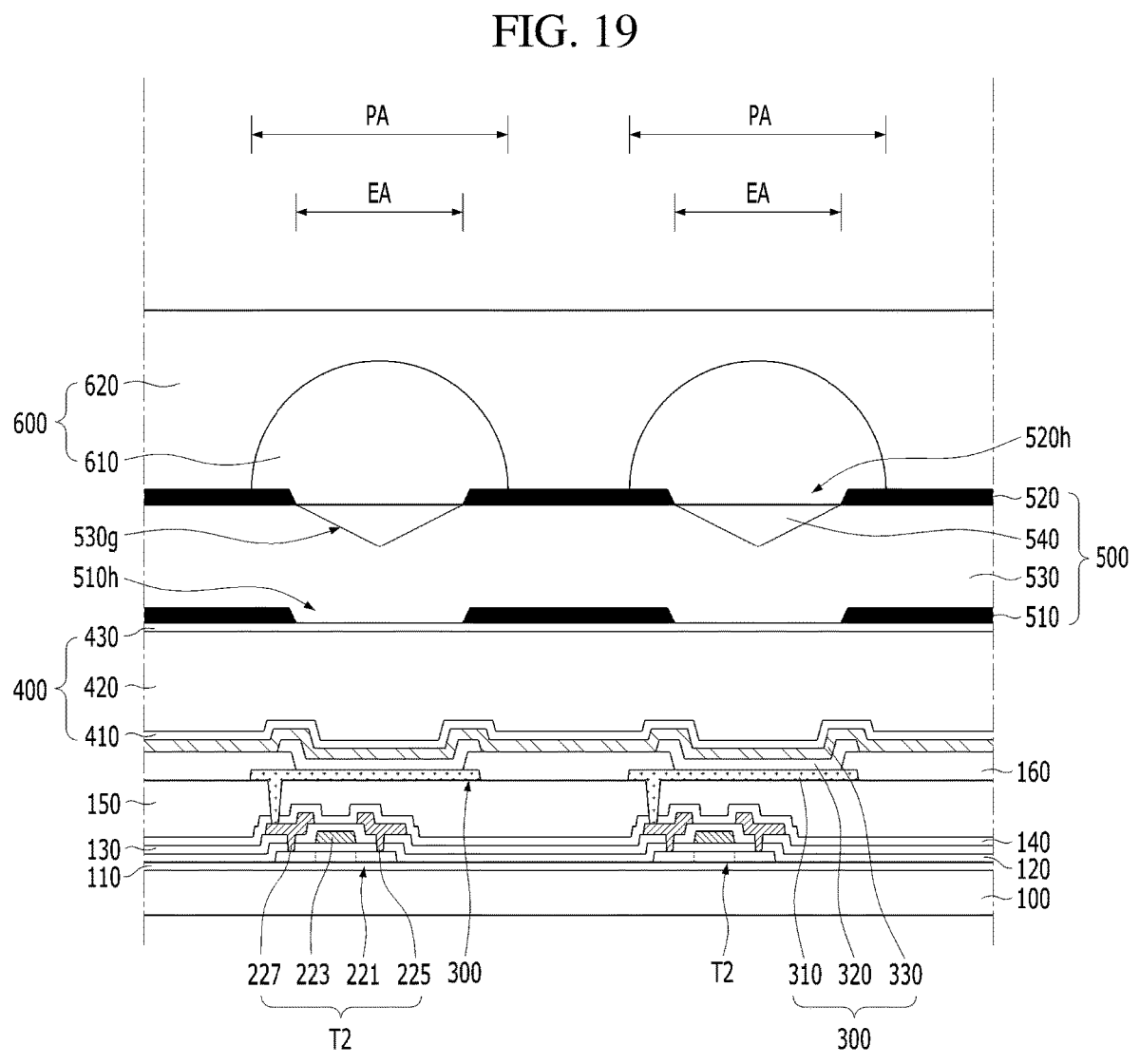

The display apparatus according to the embodiment of the present disclosure is described that the control groove 530*g* of each pixel area PA may be filled by the optical lens 610 of the corresponding pixel area PA. However, in the display apparatus according to another embodiment of the present disclosure, the control groove 530*g* of each pixel area PA may be filled by various ways. For example, in the display apparatus according to another embodiment of the present disclosure, the viewing angle control unit 500 may include optical insulating layers 540 filling the control grooves 530*g*, as shown in FIG. 19. The optical insulating layers 540 may include an insulating material. The optical insulating layers 540 may include a transparent material. The optical insulating layers 540 may have a refractive index different from the control insulating layer 530. For example, a refractive index of each optical insulating layer 540 may be between a refractive index of the control insulating layer 530 and a refractive index of each optical lens 610. The optical insulating layers 540 include a material may different from the optical lenses 610. Thus, in the display apparatus according to another embodiment of the present disclosure, the light passing through the first opening 510*h* of each pixel area PA may be primarily refracted at the boundary surface between the control insulating layer 530 and the optical insulating layer 540 in the corresponding control groove 530*g*, be secondary refracted at a boundary surface between the optical insulating layer 540 and the optical lens 610 of the corresponding pixel area PA, and be third-order refracted at a boundary surface between the optical lens 610 and the lens passivation layer 620 of the corresponding pixel area PA. Therefore, in the display apparatus according to another embodiment of the present disclosure, the amount of light passing through the second opening 520*h* may be greatly increased. That is, in the display apparatus according to another embodiment of the present disclosure, the light-extraction efficiency may be greatly improved.

The display according to another apparatus embodiment of the present disclosure may sense a touch of user and/or a tool. For example, the display apparatus according to another embodiment of the present disclosure may include a touch sensor Cm, as shown in FIGS. 20 to 24. The touch sensor Cm may sense the presence or absence of a touch and a touch position by a change of the mutual capacitance. For example, the touch sensor Cm may include driving touch lines 710 in which a touch driving signal is applied, and sensing touch lines 720 in which a touch sensing signal is applied.

Each of the driving touch lines 710 may include first touch electrodes 711 and first bridge electrodes 712. The first bridge electrodes 712 may electrically connect between the first touch electrodes 711. For example, each of driving touch lines may 710 include the first touch electrodes 711 connected in a direction by the first bridge electrodes 712.

Each of the sensing touch lines 720 may include second touch electrodes 721 and second bridge electrodes 722. The second touch electrodes 721 may be disposed between the first touch electrodes 711. For example, the first touch electrodes 711 and the second touch electrodes 721 may be alternately arranged. Thus, the display apparatus according to the embodiment of the present disclosure may sense the presence or absence of the touch of the user and/or the tool, and the touch position using the driving touch lines 710 and the sensing touch lines 720.

The second bridge electrodes 722 may electrically connect between the second touch electrodes 721. The second touch electrodes 721 may be connected in a direction perpendicular to the first touch electrodes 711 by the second bridge electrodes 722. For example, each of the sensing touch lines 720 may cross the driving touch lines 710. Each of the second bridge electrodes 722 may intersect one of the first bridge electrodes 712. The second bridge electrodes 722 may be disposed on a layer different from the first bridge electrodes 712.

The touch sensor Cm may be disposed between the encapsulation unit 400 and the optical unit 600. For example, in the display apparatus according to the embodiment of the present disclosure, the viewing angle control unit 500 may include the first black matrix 510 and the control insulating layer 520 covering the first black matrix 510, the second bridge electrode 722 may be disposed on the control insulating layer 520, and the first touch electrodes 711, the second touch electrodes 721 and the first bridge electrodes 712 may be disposed on a touch insulating layer 750 covering the second bridge electrodes 722. The touch insulating layer 750 may include an insulating material. For example, the touch insulating layer 750 may include an inorganic insulating material, such as silicon oxide (SiOx) and silicon nitride (SiNx).

The first touch electrodes 711, the first bridge electrodes 712, the second touch electrodes 721 and the second bridge electrodes 722 may include a conductive material. The first touch electrodes 711, the first bridge electrodes 712, the second touch electrodes 721 and the second bridge electrodes 722 may a material having a relatively resistance. For example, the first touch electrodes 711, the first bridge electrodes 712, the second touch electrodes 721 and the second bridge electrodes 722 may include a metal, such as copper (Cu), molybdenum (Mo), titanium (Ti) and tantalum (Ta).

The first touch electrodes 711, the first bridge electrodes 712, the second touch electrodes 721, and the second bridge electrodes 722 of the touch sensor Cm may be disposed in the display area AA. The emission area EA of each pixel area PA defined by the bank insulating layer 160 may be disposed between the first touch electrodes 711, the first bridge electrodes 712, the second touch electrodes 721, and the second bridge electrodes 722. For example, the first touch electrodes 711, the first bridge electrodes 712, the second touch electrodes 721, and the second bridge electrodes 722 may overlap the bank insulating layer 160. The first black matrix 510 may overlap the first touch electrodes 711, the first bridge electrodes 712, the second touch electrodes 721, and the second bridge electrodes 722.

A plane of each first touch electrode 711 and a plane of each second touch electrode 721 may have a mesh shape including opening overlapping with the emission area EA of each pixel area PA. Therefore, at least a part of the touch electrode, e.g., the first touch electrode 711 and/or the second touch electrode 721, may be formed with an opening that overlaps the opening in the first black matrix 510 and the light-emitting device 300 in the direction where light is emitted. Thus, in the display apparatus according to another embodiment of the present disclosure, the accuracy of the touch sensing using the touch sensor Cm may be improved, and the decrease in light-extraction efficiency due to the driving touch lines 710 and the sensing touch lines 720 may be reduced or minimized. And, in the display apparatus according to another embodiment of the present disclosure, the traveling direction of the light emitted from each light-emitting device 300 may be limited by the driving touch lines 710 and the sensing touch lines 720, which are disposed outside the emission areas EA. For example, the touch insulating layer 750 may include control grooves **750*g* overlapping with the emission area EA of each pixel area PA, and each optical lens 610 of the optical unit 600 may fill one of the control grooves 750*g* of the touch insulating layer 750**. Therefore, in the display apparatus according to another embodiment of the present disclosure, the touch of the user and/or the tool may be accurately sensed, an image of a narrow viewing angle may be realized, and the light-extraction efficiency may be effectively improved.

Figure 24:
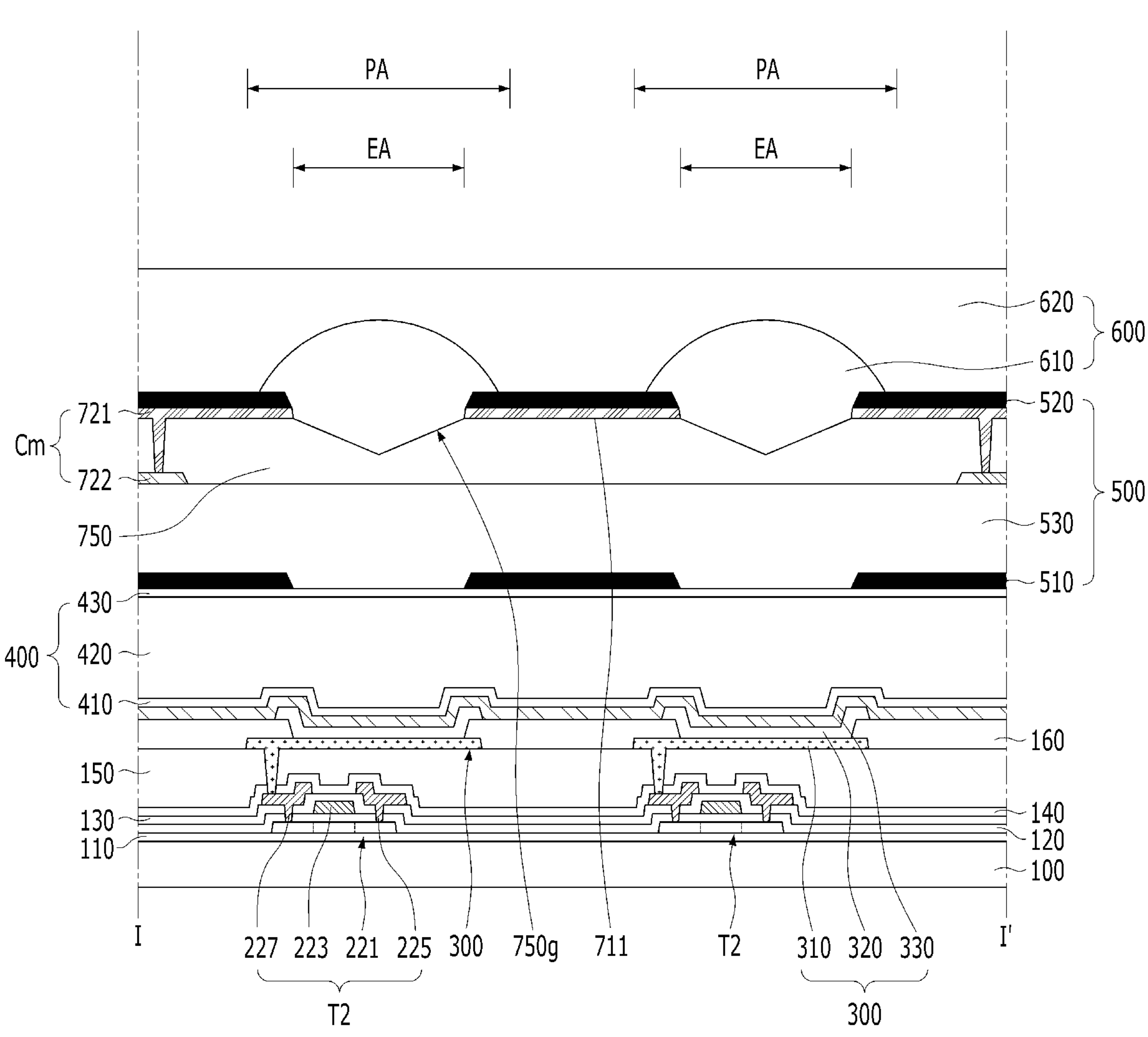

In another embodiment, as shown in FIG. 24, the touch sensor Cm may be disposed between the encapsulation unit 400 and the optical unit 600. The control insulating layer 530 is disposed on the light-emitting device 300 and may optionally cover a black matrix 510. The touch insulating layer 750 may be disposed on the control insulating layer 530. The touch insulating layer 750 may include an insulating material. For example, the touch insulating layer 750 may include an inorganic insulating material, such as silicon oxide (SiOx) and silicon nitride (SiNx).

The first bridge electrode 712 and the second bridge electrode 722 may be disposed on the control insulating layer 530, and the first touch electrodes 711 and the second touch electrodes 721 may be disposed on the touch insulating layer 750. The touch layer 750 may include an insulating insulating material. Different from FIG. 23, in one embodiment, a black matrix 520 may be disposed on at least a part of the touch electrode. Therefore, at least a part of the touch electrode, e.g., the first touch electrode 711 and/or the second touch electrode 721 and the black matrix 520 may be formed with an opening that overlaps the light-emitting device 300 in the direction where light is emitted. The optical lens 610 may be disposed on the black matrix 520 and/or at least a portion of the part of the touch electrode (e.g., part of the first touch electrode 711 or the second touch electrode 721).

In the result, the display apparatus according to the embodiments of the present disclosure may comprise the black matrix on the light-emitting device, the control insulating layer covering the black matrix and the optical lens on the control insulating layer, wherein the black matrix may include the opening overlapping with the light-emitting device, and wherein the control insulating layer may include the control groove between the light-emitting device and the optical lens. Thus, in the display apparatus according to the embodiments of the present disclosure, the light generated by the light-emitting device may be refracted toward the optical lens by the control groove. That is, in the display apparatus according to the embodiments of the present disclosure, the light-extraction efficiency of the light generated by the light-emitting device may be improved. Thereby, in the display apparatus according to the embodiments of the present disclosure, the amount of light provided to the user may be increased. And, in the display apparatus according to the embodiments of the present disclosure, the luminance deviation according to the azimuth angle may be mitigated. Furthermore, in the display apparatus according to the embodiments of the present disclosure, low-power driving may be possible by improving light extraction, power consumption may be reduced.

What is claimed is:

1. A display apparatus, comprising:

a substrate with a pixel area;

a light-emitting device formed in the pixel area for emitting light;

an encapsulation unit on the light-emitting device;

a first black matrix on the encapsulation unit, the first black matrix formed with a first opening, the first opening in the first black matrix overlapping with the light-emitting device in a first direction;

an insulating layer on the first black matrix, an upper surface of the insulating layer formed with a groove that is a recessed portion toward the substrate, the groove overlapping with the first opening in the first black matrix in the first direction;

a second black matrix on the insulating layer, the second black matrix formed with a second opening, the second opening of the second black matrix overlapping with the light-emitting device and the first opening in the first direction, the groove formed within the second opening; and an optical lens disposed above the groove in the insulating layer.

2. The display apparatus of claim 1, wherein a refractive index of the optical lens is greater than a refractive index of the insulating layer.

3. The display apparatus of claim 1, wherein at least a part of the optical lens has a convex shape or a semicircular shape.

4. The display apparatus of claim 1, wherein the recessed portion is filled with at least a portion of the optical lens.

5. The display apparatus of claim 1, wherein the recessed portion is formed with at least a first surface inclined in a second direction and a second surface inclined in a third direction different from the second direction.

6. The display apparatus of claim 1, wherein a shape of the recessed portion of the groove is at least one of a conical shape, a pyramid shape, or a prism shape.

7. The display apparatus of claim 1, wherein the light-emitting device includes a first electrode, a light-emitting layer, and a second electrode, and wherein a size of an emission area of the light-emitting device where the first electrode, the light-emitting layer, and the second electrode overlap is larger than an area of the opening of the black matrix.

8. The display apparatus of claim 1, wherein a size of the recessed portion is smaller than an area of the opening in the black matrix, and wherein an end of the optical lens contacts a side surface of the black matrix in the opening.

9. The display apparatus of claim 1, wherein a surface of the recessed portion of the groove is curved.

10. The display apparatus of claim 1, wherein a bottom surface of the recessed portion is substantially flat, and a side surface of the recessed portion is perpendicular to the bottom surface of the recessed portion.

11. The display apparatus of claim 1, wherein the recessed portion is formed with at least a first surface inclined in a second direction and a second surface inclined in a third direction different from the second direction, and a third surface perpendicular to the upper surface of the insulating layer.

12. The display apparatus of claim 1, wherein the recessed portion is filled with an optical insulating layer, and the optical lens is disposed on the optical insulating layer, and wherein a refractive index of the optical insulating layer is between a refractive index of the optical lens and a refractive index of the insulating layer.

13. The display apparatus of claim 1, further comprising a lens passivation layer covering the optical lens, wherein a refractive index of the lens passivation layer is equal to or greater than a refractive index of the optical lens.

14. The display apparatus of claim 1, wherein a first width of the recessed portion of the groove from a first distance from the substrate is wider than a second width of the recessed portion of the groove from a second distance smaller than a first distance from the substrate.

15. The display apparatus of claim 1, wherein the optical lens is disposed on at least a portion of the black matrix.

* * * * *